(12) United States Patent
Lee et al.

(10) Patent No.: US 7,800,956 B2
(45) Date of Patent: Sep. 21, 2010

(54) PROGRAMMING ALGORITHM TO REDUCE DISTURB WITH MINIMAL EXTRA TIME PENALTY

(75) Inventors: Dana Lee, Saratoga, CA (US);
Deepanshu Dutta, Santa Clara, CA (US); Yingda Dong, Sunnyvale, CA (US)

(73) Assignee: Sandisk Corporation, Milpitas, CA (US)

( * ) Notice: Subject to any disclaimer, the term of this patent is extended or adjusted under 35 U.S.C. 154(b) by 161 days.

(21) Appl. No.: 12/163,073

(22) Filed: Jun. 27, 2008

(65) Prior Publication Data

US 2009/0323429 A1    Dec. 31, 2009

(51) Int. Cl.
 *G11C 11/34* (2006.01)
(52) U.S. Cl. .................. 365/185.22; 365/185.18; 365/185.19; 365/185.24; 365/185.29
(58) Field of Classification Search .......... 365/185.22, 365/185.18, 185.19, 185.24, 185.29
See application file for complete search history.

(56) References Cited

U.S. PATENT DOCUMENTS

| | | | |
|---|---|---|---|
| 5,386,422 | A | 1/1995 | Endoh et al. |
| 5,570,315 | A | 10/1996 | Tanaka et al. |
| 5,751,637 | A | 5/1998 | Chen et al. |
| 5,774,397 | A | 6/1998 | Endoh et al. |
| 5,812,457 | A | 9/1998 | Arase |
| 6,046,935 | A | 4/2000 | Takeuchi et al. |
| 6,222,762 | B1 | 4/2001 | Guterman et al. |
| 6,327,183 | B1 | 12/2001 | Pawletko et al. |
| 6,456,528 | B1 | 9/2002 | Chen |
| 6,522,580 | B2 | 2/2003 | Chen et al. |
| 6,714,448 | B2 | 3/2004 | Manea |
| 6,781,877 | B2 | 8/2004 | Cernea et al. |
| 6,788,579 | B2 | 9/2004 | Gregori et al. |
| 6,859,397 | B2 | 2/2005 | Lutze et al. |
| 6,888,758 | B1 | 5/2005 | Hemink et al. |
| 6,917,542 | B2 | 7/2005 | Chen et al. |
| 7,020,017 | B2 | 3/2006 | Chen et al. |

(Continued)

FOREIGN PATENT DOCUMENTS

WO    WO2008/064480    6/2008

OTHER PUBLICATIONS

PCT International Search Report and Written Opinion of the International Searching Authority dated Nov. 4, 2009, PCT Patent Appl. PCT/US2009/048311.

*Primary Examiner*—Son Dinh
(74) *Attorney, Agent, or Firm*—Vierra Magen Marcus & DeNiro LLP

(57) ABSTRACT

Programming time is reduced in a non-volatile memory in a multi-pass programming process. In a first programming pass, high state cells are programmed by a sequence of program pulses to identify fast and slow high state cells, while lower state cells are locked out from programming. Once identified, the fast high state cells are temporarily locked out from programming while the slow high state cells continue being programmed to their final intended state. Further, the program pulses are sharply stepped up to program the slow high state cells. In a second programming pass, the fast high state cells are programmed along with the other, lower state cells, until they all reach their respective intended states. A time savings is realized compared to approaches in which all high state cells are programmed in the first programming pass.

26 Claims, 19 Drawing Sheets

U.S. PATENT DOCUMENTS

| | | |
|---|---|---|
| 7,023,736 B2 | 4/2006 | Cemea et al. |
| 7,046,568 B2 | 5/2006 | Cemea |
| 7,088,621 B2 | 8/2006 | Guterman et al. |
| 7,092,290 B2 | 8/2006 | Hemink |
| 7,120,051 B2 | 10/2006 | Gorobets et al. |
| 7,173,859 B2 | 2/2007 | Hemink |
| 7,196,928 B2 | 3/2007 | Chen |
| 7,196,931 B2 | 3/2007 | Cemea et al. |
| 7,218,552 B1 | 5/2007 | Wan et al. |
| 7,237,074 B2 | 6/2007 | Guterman et al. |
| 7,327,619 B2 | 2/2008 | Chan et al. |
| 2003/0002348 A1 | 1/2003 | Chen |
| 2006/0104120 A1* | 5/2006 | Hemink ............ 365/185.28 |
| 2006/0140007 A1 | 6/2006 | Cemea et al. |
| 2007/0074194 A1 | 3/2007 | Hahn et al. |
| 2007/0291556 A1* | 12/2007 | Kamei ............ 365/189.09 |
| 2008/0019183 A1 | 1/2008 | Chae et al. |
| 2008/0019187 A1* | 1/2008 | Kux et al. ............ 365/185.22 |

\* cited by examiner

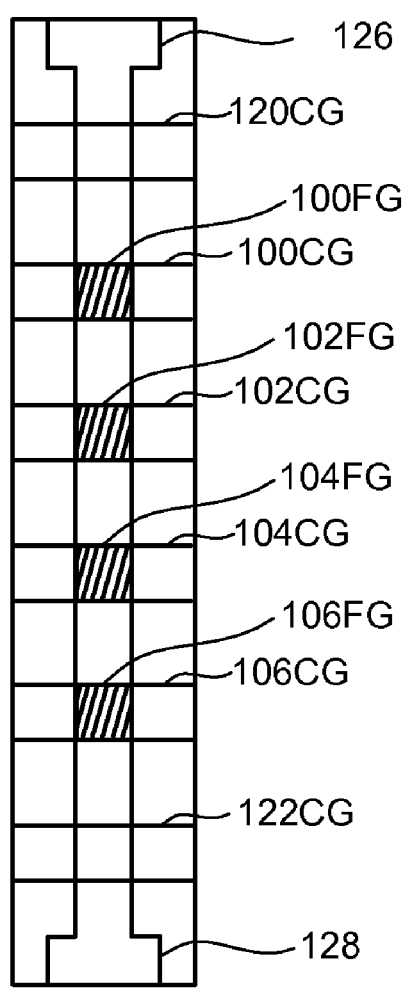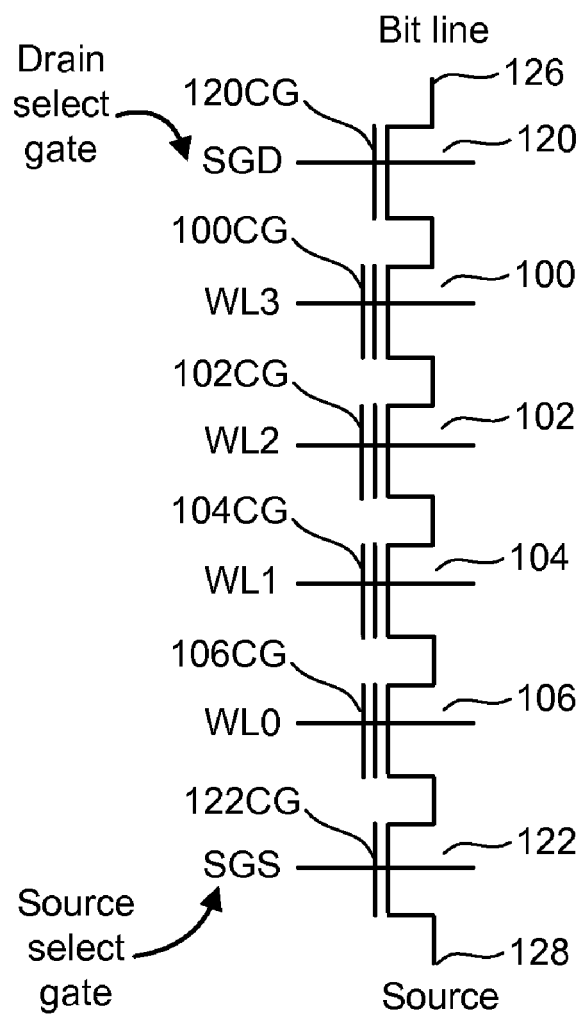

All B and C cells programmed to state LM / All C cells programmed to state C

A cells verified / A and B cells verified / B cells verified

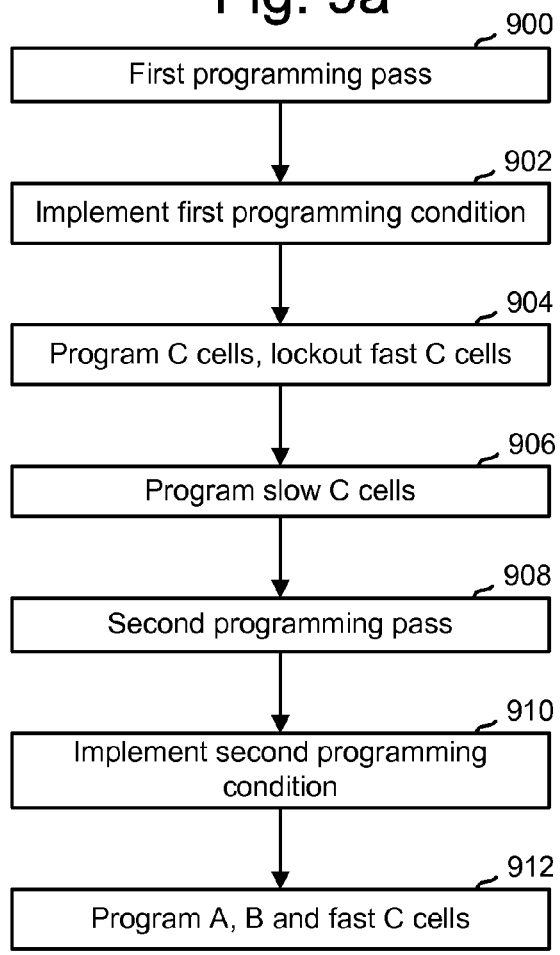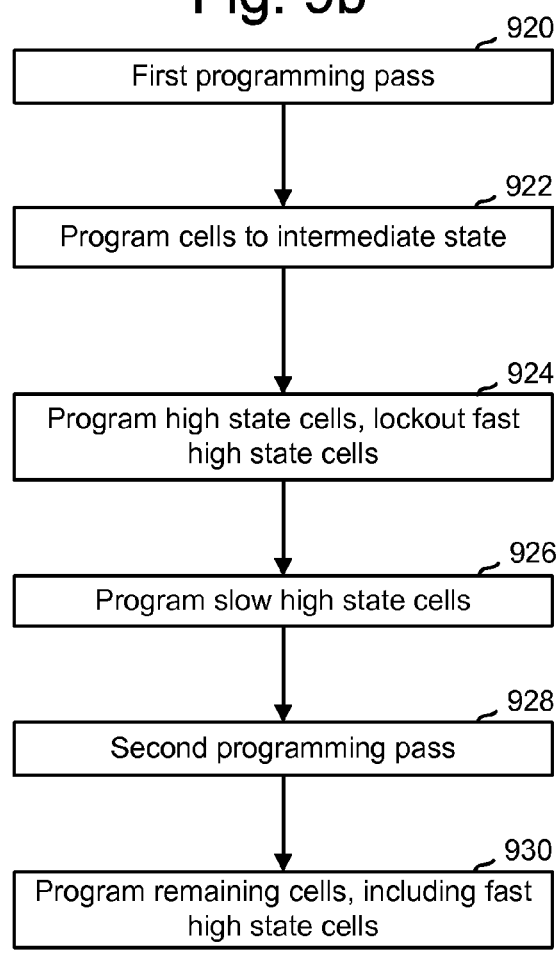

Fig. 10

| Program pulse # | Case #1 Verify level(s) | Case #2 Verify level(s) | Case #3 Verify level(s) |
|---|---|---|---|
| 1 | AL, A | AL, A | AL, A |
| 2 | AL, A | AL, A | AL, A |
| 3 | AL, A | AL, A | AL, A |
| 4 | AL, A | AL, A | AL, A |
| 5 | AL, A | AL, A | AL, A |
| 6 | AL, A | AL, A | AL, A |
| 7 | AL, A, BL, B | AL, A, BL, B | AL, A, BL, B |
| 8 | AL, A, BL, B | AL, A, BL, B | AL, A, BL, B |
| 9 | AL, A, BL, B | AL, A, BL, B | AL, A, BL, B |
| 10 | AL, A, BL, B | AL, A, BL, B | AL, A, BL, B |
| 11 | AL, A, BL, B | AL, A, BL, B | AL, A, BL, B, CLL |
| 12 | AL, A, BL, B, CL, C | AL, A, BL, B, C | AL, A, BL, B, CL, C, CLL |
| 13 | AL, A, BL, B, CL, C | AL, A, BL, B, C | AL, A, BL, B, CL, C, CLL |
| 14 | BL, B, CL, C | BL, B, C | BL, B, CL, C, CLL |
| 15 | BL, B, CL, C | BL, B, C | BL, B, CL, C |
| 16 | BL, B, CL, C | BL, B, C | BL, B, CL, C |
| 17 | BL, B, CL, C | BL, B, C | BL, B, CL, C |
| 18 | BL, B, CL, C | BL, B, C | BL, B, CL, C |
| 19 | BL, B, CL, C | BL, B, C | BL, B, CL, C, C |
| 20 | CL, C | C | BL, B, CL, C, C |
| 21 | CL, C | C | CL, C, C |
| 22 | CL, C | | CL, C, C |

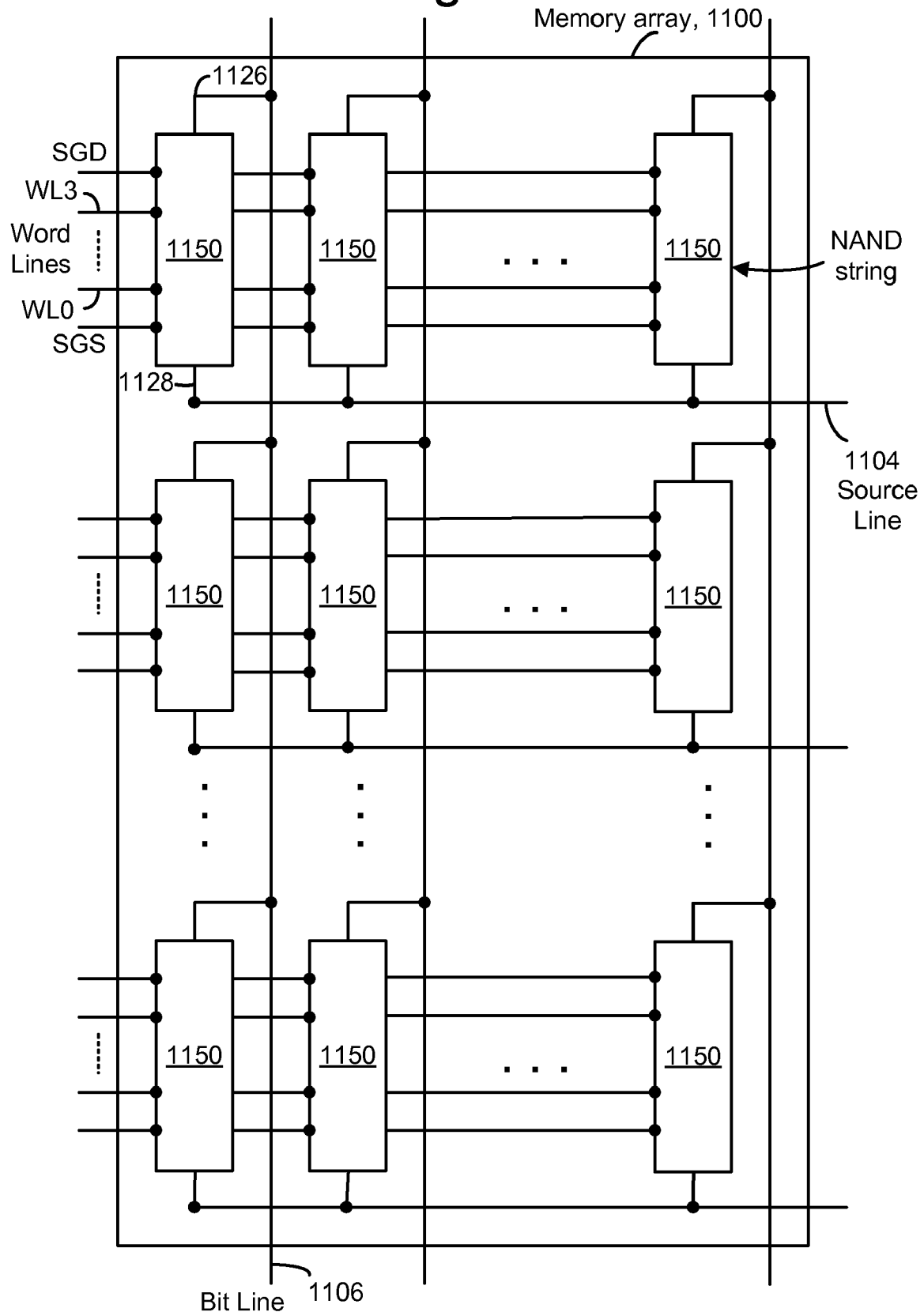

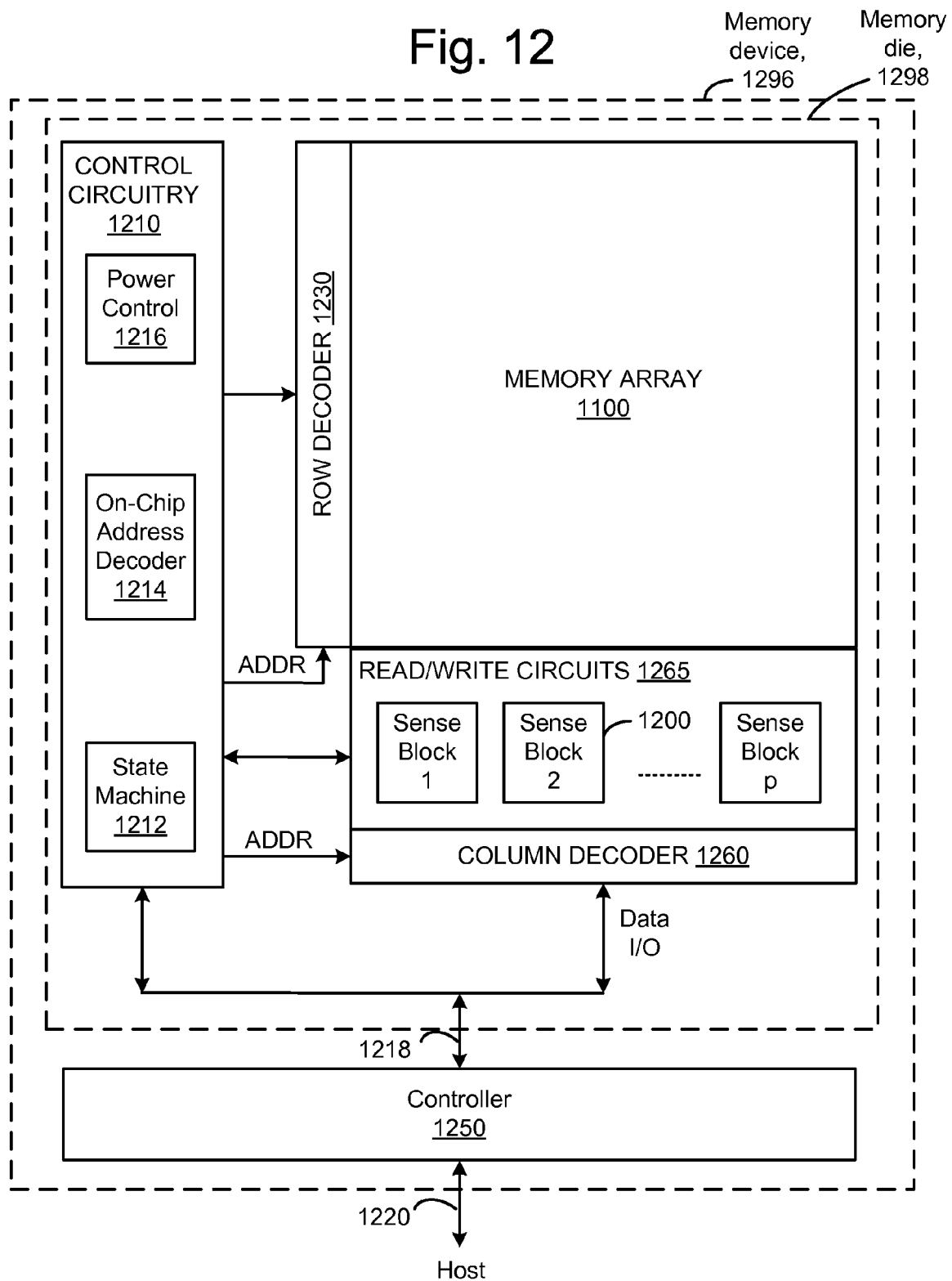

PROGRAMMING ALGORITHM TO REDUCE DISTURB WITH MINIMAL EXTRA TIME PENALTY

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. Nos. 6,859,397 and 6,917,542, both of which are incorporated herein by reference in their entirety.

However, one issue which continues to be problematic is program disturb. Program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Multi-pass programming techniques can reduce program disturb by programming storage elements more gradually. However, programming time is increased.

SUMMARY OF THE INVENTION

The present invention addresses the above and other issues by providing a programming technique which reduces program disturb in a non-volatile storage system while also reducing programming time.

In one embodiment, a method for operating non-volatile storage includes performing programming operations on a first set of storage elements using a first verify level less an offset to distinguish slower and faster programming storage elements, while locking out at least a second set of storage elements from being programmed. The method further includes locking out the faster programming storage elements while continuing programming of the slower programming storage elements using the first verify level and while continuing to lock out the at least a second set of storage elements. The method further includes locking out the slower programming storage elements while resuming programming of the faster programming storage elements using the first verify level and while programming the at least a second set of storage elements using at least a second verify level which is less than the first verify level less the offset.

In another embodiment, a method for operating non-volatile storage includes programming storage elements which are intended to be programmed to a first data state associated with a first verify level, while locking out from programming other storage elements which are intended to be programmed to at least second and third data states associated with second and third verify levels, respectively, which are below the first verify level. The method further includes, during the programming, distinguishing slower and faster programming storage elements among the storage elements which are intended to be programmed to the first data state, and locking out the faster programming storage elements while continuing programming of the slower programming storage elements. The method further includes subsequently programming the at least a second set of storage elements to the at least second and third data states, while resuming programming of the faster programming storage elements to the first data state, and applying a programming condition for the continuing programming of the slower programming storage elements which differs from a programming condition for the resuming programming of the faster programming storage elements.

In another embodiment, a method for operating non-volatile storage includes: a) programming storage elements which are intended to be programmed to a first data state associated with a first verify level, while locking out from programming other storage elements which are intended to be programmed to at least second and third data states associated with second and third verify levels, respectively, which are below the first verify level. The method further includes: b) subsequently programming the at least a second set of storage elements, where step a) uses a programming condition which differs from a programming condition of step b).

In another embodiment, a non-volatile storage system includes a first set of storage elements, and at least one control circuit in communication with the first set of storage elements. The at least one control circuit: (a) performs programming operations on the first set of storage elements using a first verify level less an offset to distinguish slower and faster programming storage elements, while locking out at least a second set of storage elements from being programmed, (b) locks out the faster programming storage elements while continuing programming of the slower programming storage elements using the first verify level and while continuing to lock out the at least a second set of storage elements, and (c) locks out the slower programming storage elements while resuming programming of the faster programming storage elements using the first verify level and while programming the at least a second set of storage elements using at least a second verify level which is less than the first verify level less the offset.

Corresponding methods, systems and computer- or processor-readable storage devices for performing the methods provided herein may be provided.

BRIEF DESCRIPTION OF THE DRAWINGS

FIG. 1 is a top view of a NAND string.

FIG. 2 is an equivalent circuit diagram of the NAND string of FIG. 1.

FIG. 9a describes a multi-pass programming process in which a different programming condition is used in each pass.

FIG. 9b describes a multi-pass programming process in which high state cells are programmed before lower state cells.

FIG. 10 depicts a table of program pulse number versus verify level for three different programming techniques.

FIG. 11 is a block diagram of an array of NAND flash storage elements.

FIG. 12 is a block diagram of a non-volatile memory system using single row/column decoders and read/write circuits.

DETAILED DESCRIPTION

The present invention provides a programming technique which reduces program disturb in a non-volatile storage system while also reducing programming time.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
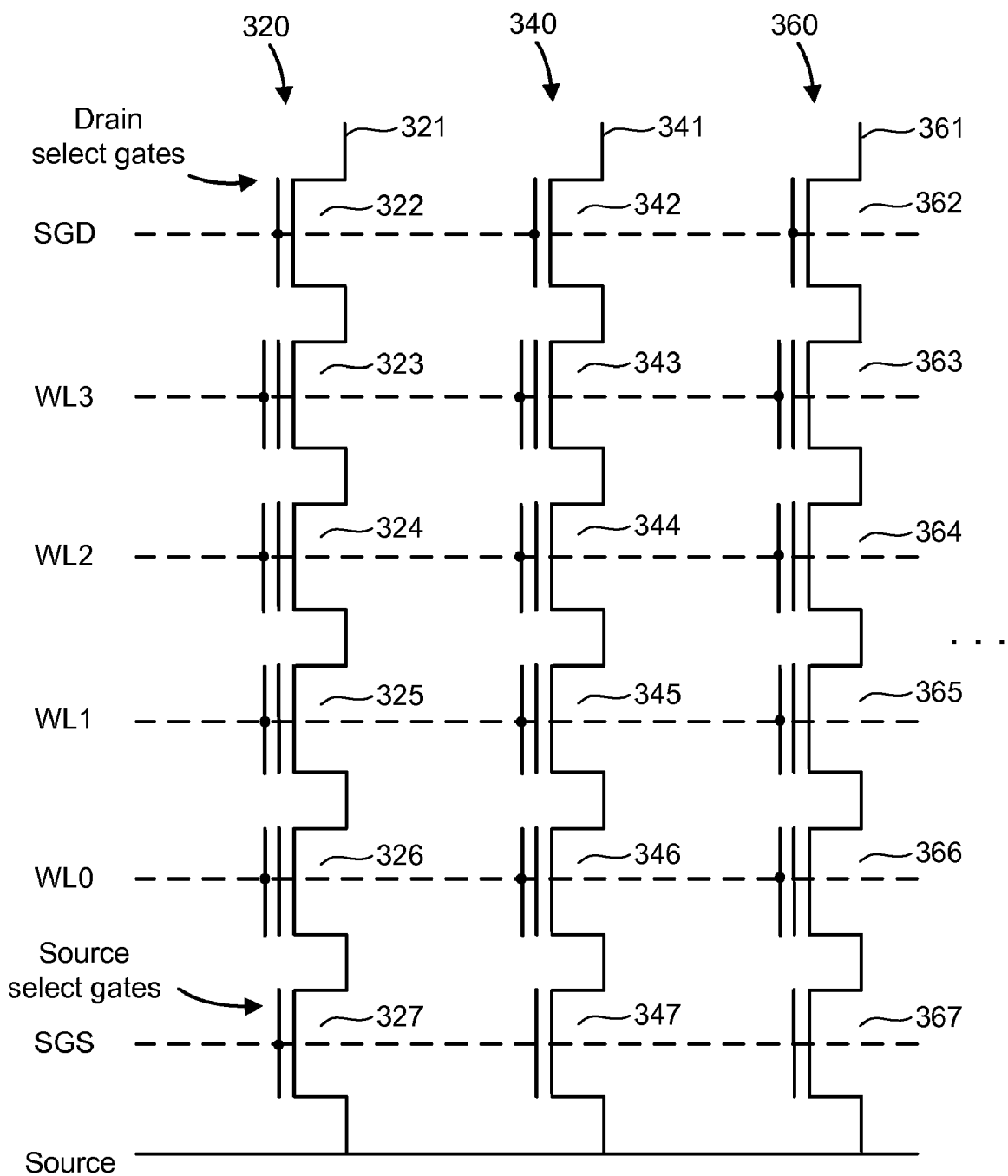
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

Figure 4:
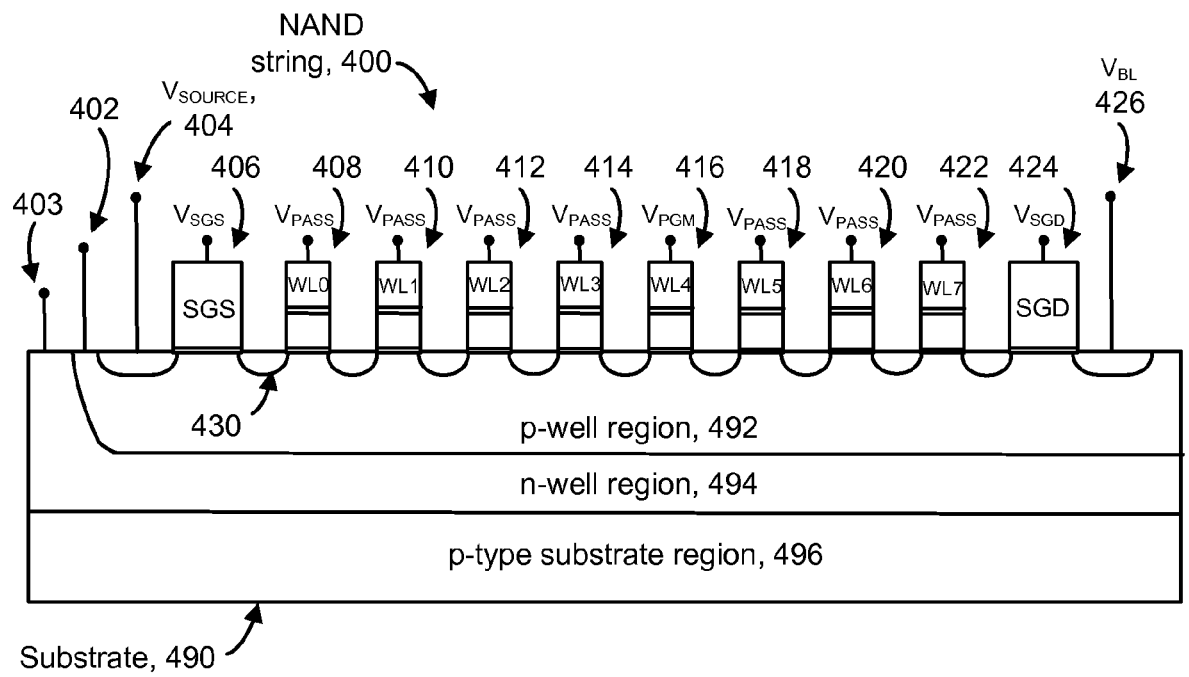
FIG. 4 depicts a cross-sectional view of a NAND string formed on a substrate.

FIG. 4 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 492 via a terminal 402 and/or to the n-well region 494 via a terminal 403.

During a program operation, a control gate voltage $V_{PGM}$ is provided on a selected word line, in this example, WL3, which is associated with storage element 414. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. Some boosting schemes apply different pass voltages to different word lines. $V_{SGS}$ and $V_{SGD}$ are applied to the select gates 406 and 424, respectively.

FIGS. 5a-e depict threshold voltages of storage elements in a multi-pass programming technique in which a highest state is programmed before lower states. Inverse programming sequences can reduce the impact of disturbs and neighbor-cell interference effects. One example of such a programming technique is "C-first," where the C state represents the highest state in a four data state, multi-level implementation. The technique can be extended to eight, sixteen or other numbers of states. Such techniques involve programming all of the highest state cells to their intended state before programming lower state cells to their intended states. Typically, two or more passes are performed, where a sequence of program pulses is repeated in each programming pass. For example, a step-wise increasing sequence of program pulses may be applied in each pass.

Figure 5A:
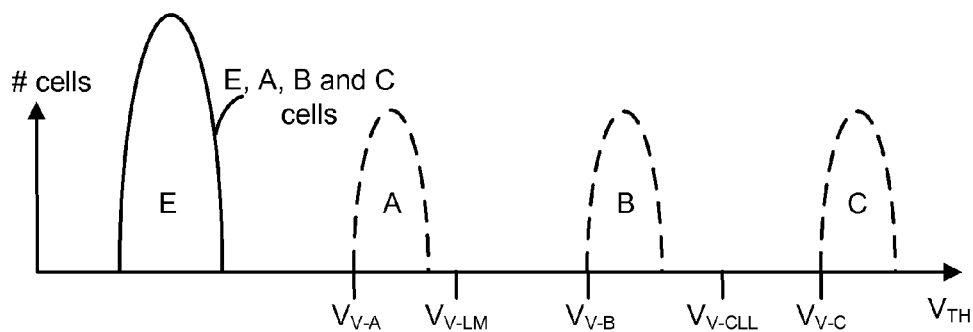
FIGS. 5a-e depict threshold voltages of storage elements in a multi-pass programming technique in which a highest state is programmed before lower states.

FIG. 5a depicts a threshold voltage distribution of a set of storage elements after an erase operation. The x-axis depicts threshold voltage ($V_{TH}$) for four different states: erased state (E), state A, state B and state C. The y-axis indicates the number of cells or storage elements in each state. A voltage verify level is also indicated for each state, namely $V_{V-A}$, $V_{V-B}$ and $V_{V-C}$ for states A, B and C, respectively. The drawings are not necessarily to scale, but the higher magnitude of the erased state distribution is meant to indicate that all of the cells are in that state. States A, B and C are shown using dashed lines to depict that no cells are currently in those states. FIG. 5a indicates that E, A, B and C cells are in the erased state. The terms "A cell," "B cell" or "C cell" or similar are meant to refer to a cell which is intended to be programmed to state A, B or C, respectively, as its final state at the completion of programming.

Figure 5B:
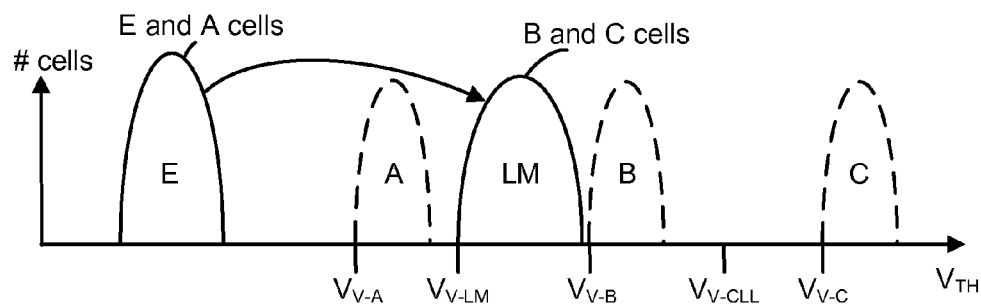
Figure 5C:
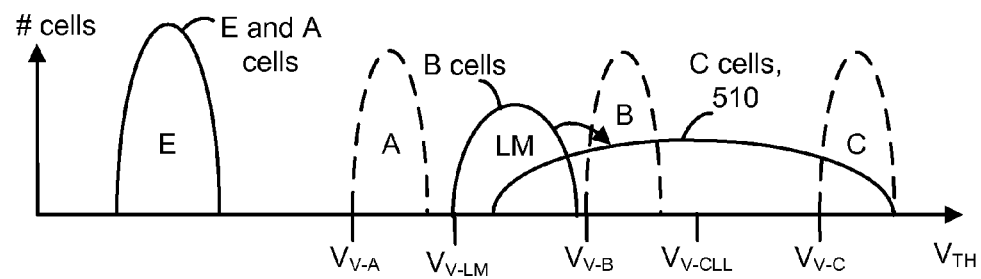
Figure 5D:
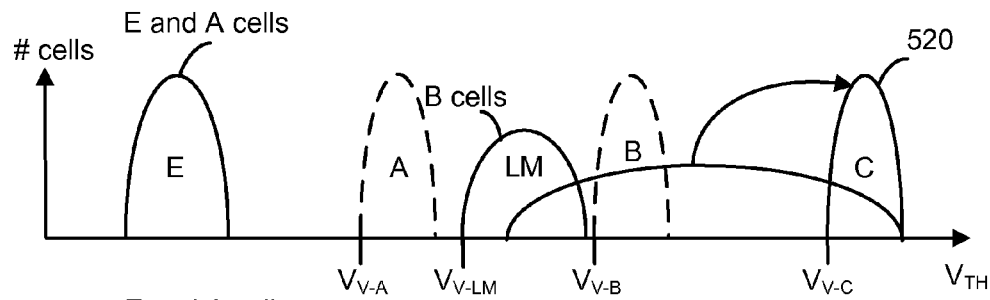
Figure 7A:
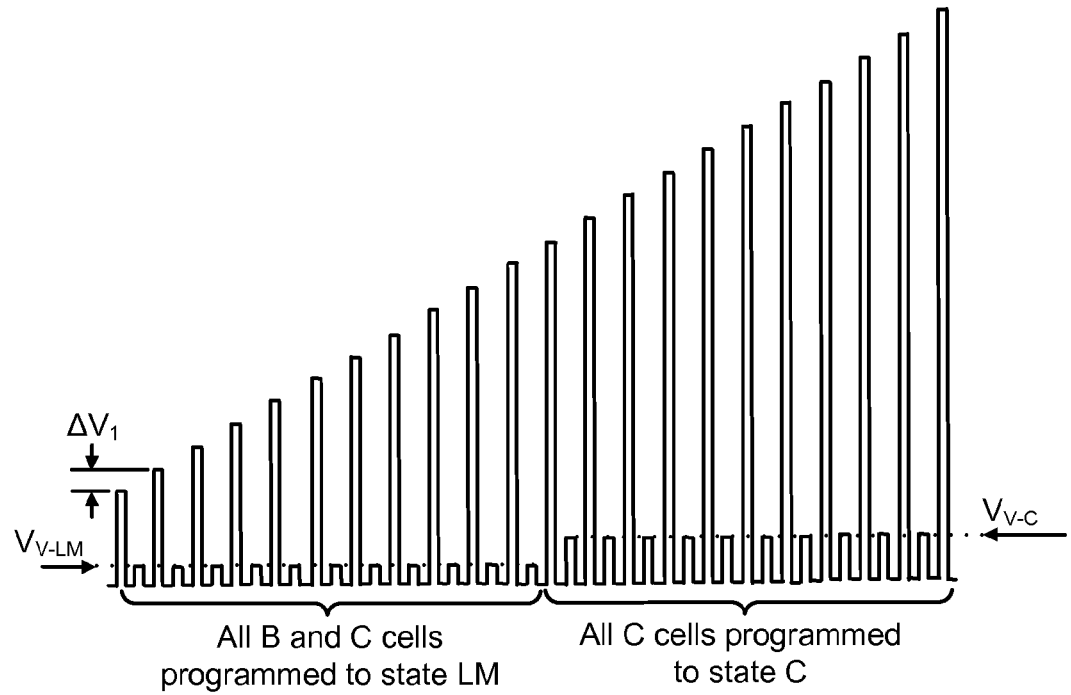
FIG. 7a depicts program and verify voltages in a programming sequence corresponding to FIGS. 5a-d.

A first part of a first programming pass is depicted in FIGS. 5b-d. In FIG. 5b, the B and C cells are programmed from the erased state to an intermediate or temporary state referred to as "state LM" (e.g., lower-middle). The threshold voltage distribution of the LM state, and other states, in general, will have a spread due to overshoots and other limits to the programming accuracy. The E and A cells remain in the erased state. In this programming pass, a sequence of program pulses is applied, e.g., starting at an initial pulse level and proceeding step wise to a final pulse level. For example, refer to FIG. 7a, which depicts program and verify voltages in a first programming pass. The x-axis denotes time and the y-axis denotes voltage. The program pulses increase step wise and are higher in magnitude than the verify pulses. In the first part of the first programming pass, the cells are verified against $V_{V-LM}$. (In this notation, the capital V represents voltage, and the subscript V-LM represents "verify" and "LM state.") The programmed cells are locked out from further programming when their $V_{TH}$ is verified to have reached $V_{V-LM}$. In the example of FIG. 7a, all B and C cells have reached the LM state after the eleventh program pulse.

At this time, a second part of the first programming pass begins. As depicted in FIG. 5c, only the C cells, e.g., the highest state cells, are programmed. The C cells are programmed from the LM state and are verified against $V_{V-C}$. The reduced amplitude on the LM state is meant to indicate that fewer cells are in the LM state. That is, B cells remain in the LM state as the C cells are programmed higher. Some cells will program relatively quickly while others program relatively slowly, e.g., due to different characteristics of the cells, their relative location in a memory device and other factors. As a result, during the programming, the C cells will be initially spread out in a relatively wide threshold voltage distribution 510. As the programming of the second part of the first programming pass continues, the C cells will be programmed to the C state distribution 520 as depicted in FIG. 5d.

Figure 5E:
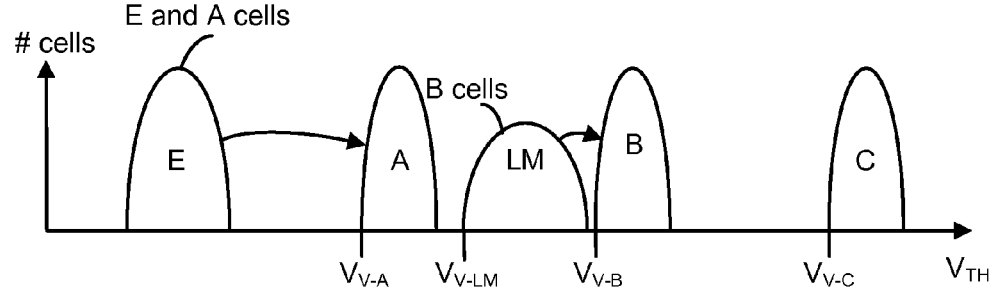
Figure 6F:
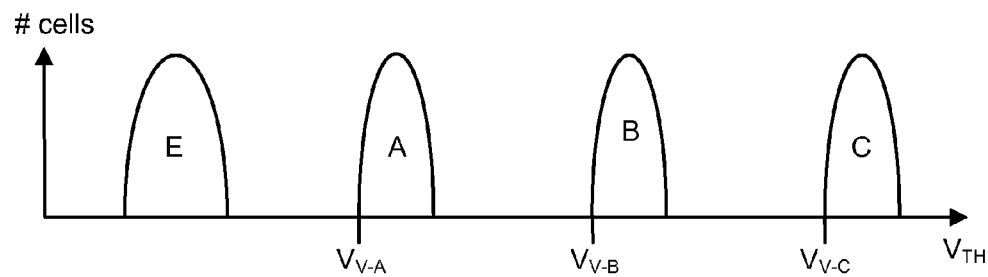
Figure 7B:
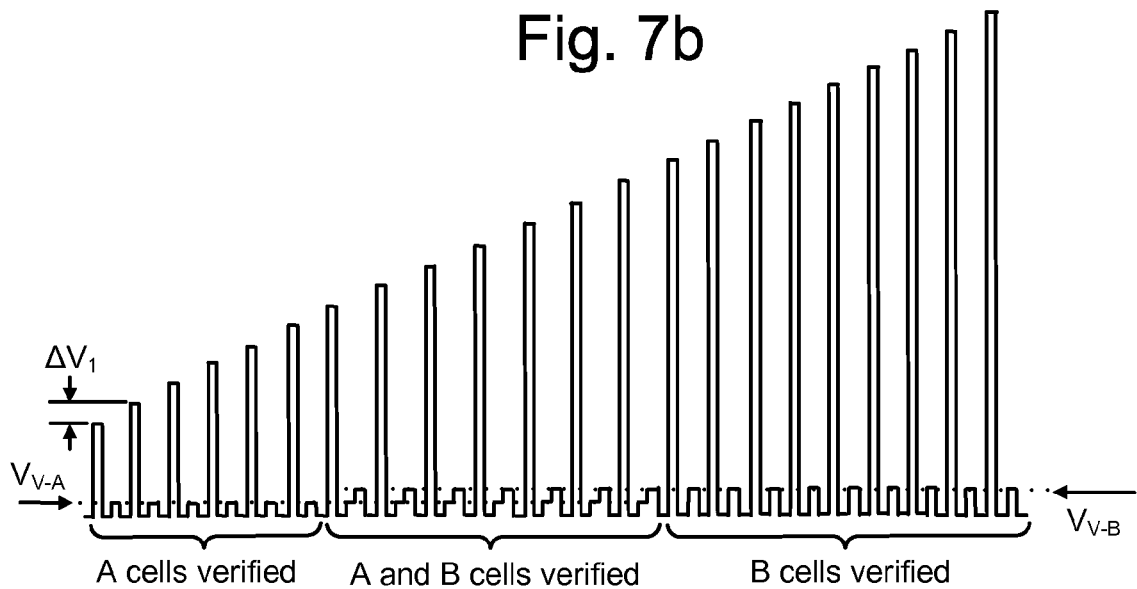
FIG. 7b depicts program and verify voltages in a programming sequence corresponding to FIG. 5e.

In a second programming pass, the series of program pulses are again applied to the cells to be programmed, e.g., via a selected word line, as depicted in FIG. 5e and FIG. 7b. The A cells are programmed from the erased state to the A state, while the B cells are programmed from the LM state to the B state. In one approach, a verification is performed for the A cells only, after each of the first six program pulses, a verification is performed for the A and B cells after each of the next seven program pulses, and a verification is performed for the B cells only after each of the remaining program pulses. In this example, the total number of program pulses is twenty two. After programming is complete, the threshold voltage distribution of FIG. 6f is achieved.

The above approach involves repeating the entire sequence of program pulses in separate passes, depicted by FIGS. 7a and 7b, which consumes extra time compared to, e.g., a one pass programming technique such as discussed below in connection with FIG. 16. On the other hand, the impact of program disturb and neighbor-cell interference effects is reduced. It would be desirable to maintain these benefits while reducing programming time.

One approach involves skipping many of the repeated program pulses and thus reducing programming time while preserving the major benefits of a multi-pass programming technique, as explained now in further detail.

FIGS. 6a-g depict threshold voltages of storage elements in a modified multi-pass programming technique in which a highest state is programmed before lower states. This proposal modifies the C-first sequence discussed above as follows. In a first programming pass, after the cells have been programmed to the LM state, an initial pulse (or sequence of pulses) is applied to program the C cells up toward the final state. Fast cells which have a high $V_{TH}$ are identified using a $V_{V-CLL}$ verify level and temporarily locked out. The next program pulse ($V_{PGM}$) is incremented by a large amount which is appropriate to program the slow C cells which were not locked out. By incrementing $V_{PGM}$ a large amount, we can skip pulses and save time. Programming of the slow C cells then continues until the highest $V_{PGM}$ is applied. In a second programming pass, the fast C cells which were temporarily locked out are returned to the selected population. $V_{PGM}$ is returned to the initial value and ramped up again through the last program pulse, programming the A, B and fast C cells together. The fast C cells are able to program within this sequence quickly and thus do not require extra time. In a particular implementation, we use C-first (or last-state-first) programming. The technique can be adapted to schemes which use fewer or more than four programming states. Also, the fast-slow distinction can be made for one or more high states.

Figure 6A:
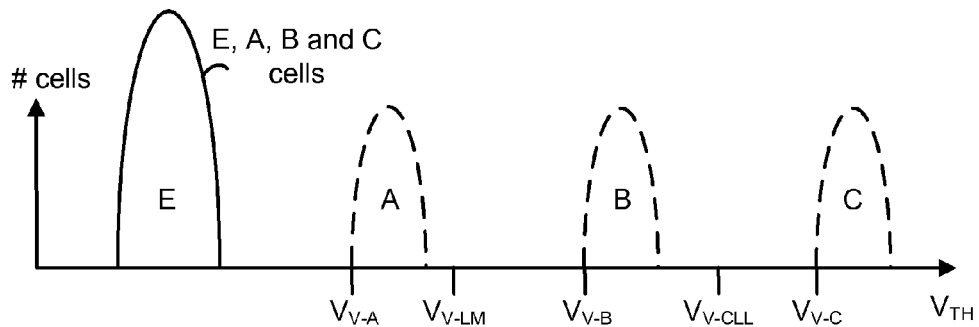
FIGS. 6a-g depict threshold voltages of storage elements in a modified multi-pass programming technique in which a highest state is programmed before lower states.
Figure 6B:
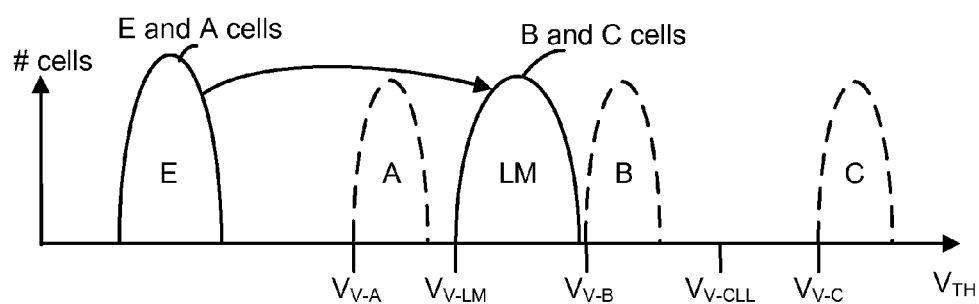
Figure 6C:
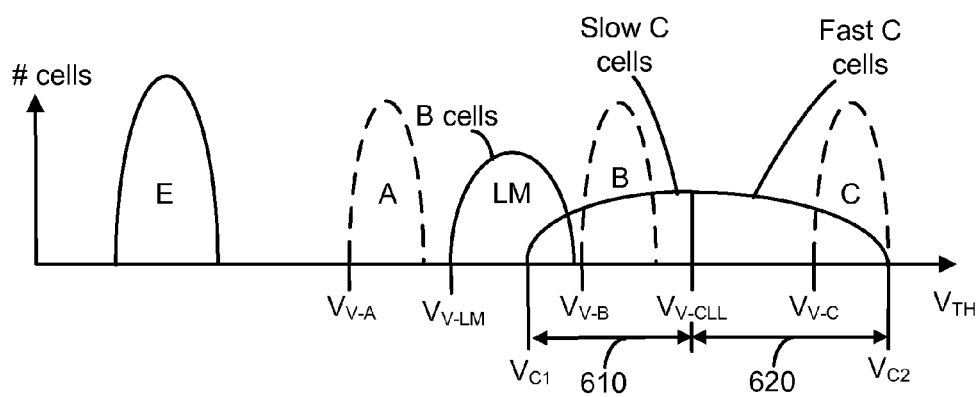

FIG. 6a depicts the starting threshold voltage distribution, with all cells in the erased state. Referring also to FIG. 7c, which depicts program and verify voltages in a programming technique corresponding to FIGS. 6a-d. In a first phase of a first programming pass, all B and C cells are programmed from the erased state to the LM state, using a verify level of $V_{V-LM}$, resulting in the threshold voltage distribution of FIG. 6b. In this phase, program voltages are applied starting at a minimum level and each pulse is incremented by a step size $\Delta V_1$, in one possible approach. In one possible implementation, eleven program pulses are applied in this phase. It should be understood that the numerical examples provided can be adjusted to optimize specific applications. Generally, all voltage levels and other parameters used during programming and verify can be optimized for a specific application. This includes the initial and final program pulses level, the various step sizes and increments, the number of program pulses in each phase, and the verify levels.

In a second phase of the first programming pass, a threshold voltage detection is performed to separate fast C cells from slow C cells. Thus, the fast and slow memory cells are identified or grouped. The C cells are programmed from the LM state to a range of threshold voltages between values $V_{C1}$ and $V_{C2}$, as indicated in FIG. 6c. As depicted in FIG. 7c, the initial program pulse in phase 2 is stepped up by $\Delta V_2$, and each successive program pulse in phase 2 is incremented by $\Delta V_3$. For instance, $\Delta V_2$ and $\Delta V_3$ may be greater than $\Delta V_1$ so that programming proceeds relatively quickly for the C cells. Also during the second phase, the C cells are verified against a new verify level $V_{V-CLL}$ so that it is possible to determine fast and slow programming C cells. (Note that, in contrast to $V_{V-CLL}$, $V_{V-CL}$, discussed below in connection with FIG. 6g, denotes a coarse mode verify level for state C). $V_{V-CLL}$ is equal to $V_{V-C}$ less an offset $\Delta$, and can be optimized for a specific application. In an example implementation, three program pulses are used in phase 2; however, one or more program pulses may be used, depending on a characterization of the memory device. The number of program pulses used should be sufficient to program the C cells to a threshold voltage distribution which allows distinguishing between slow and fast programming cells.

Alternatively, the decision to conclude phase 3 can be determined adaptively on a "per-case" basis as a function of the number of C cells, or the portion of C cells in a set of C cells such as in a word line or block, for which $V_{TH} > V_{V-CLL}$. For example, phase 2 can be completed once the first C cell reaches $V_{TH} > V_{V-CLL}$. It is also possible to complete phase 2 after some fixed number of additional program pulses after a pre-determined number or portion of cells reach $V_{TH} > V_{V-CLL}$.

After phase 2 is completed, the threshold voltage of the slow C cells will be in a range 610 between $V_{C1}$ and $V_{V-CLL}$, and the threshold voltage of the fast C cells will be in a range 620 between $V_{V-CLL}$ and $V_{C2}$. Note that this example indicates that the distribution of slow and fast C cells is about 50% and 50%, respectively. However, it is not necessary for the number of fast and slow C cells to be equal. Further, regarding the range of the threshold voltage distribution, the example indicates that the low end of the distribution at $V_{C1}$ falls within the LM distribution. However, this is not necessary as the low end of the distribution at $V_{C1}$ may be above the LM distribution. Further, the high end of the C cell distribution at $V_{C2}$ is indicated as being at the high end of the final C state distribution, but it may alternatively be lower.

Figure 6D:
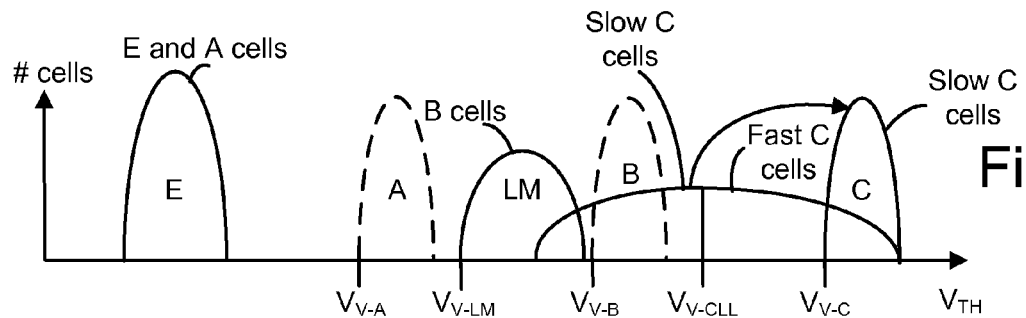
Figure 7C:
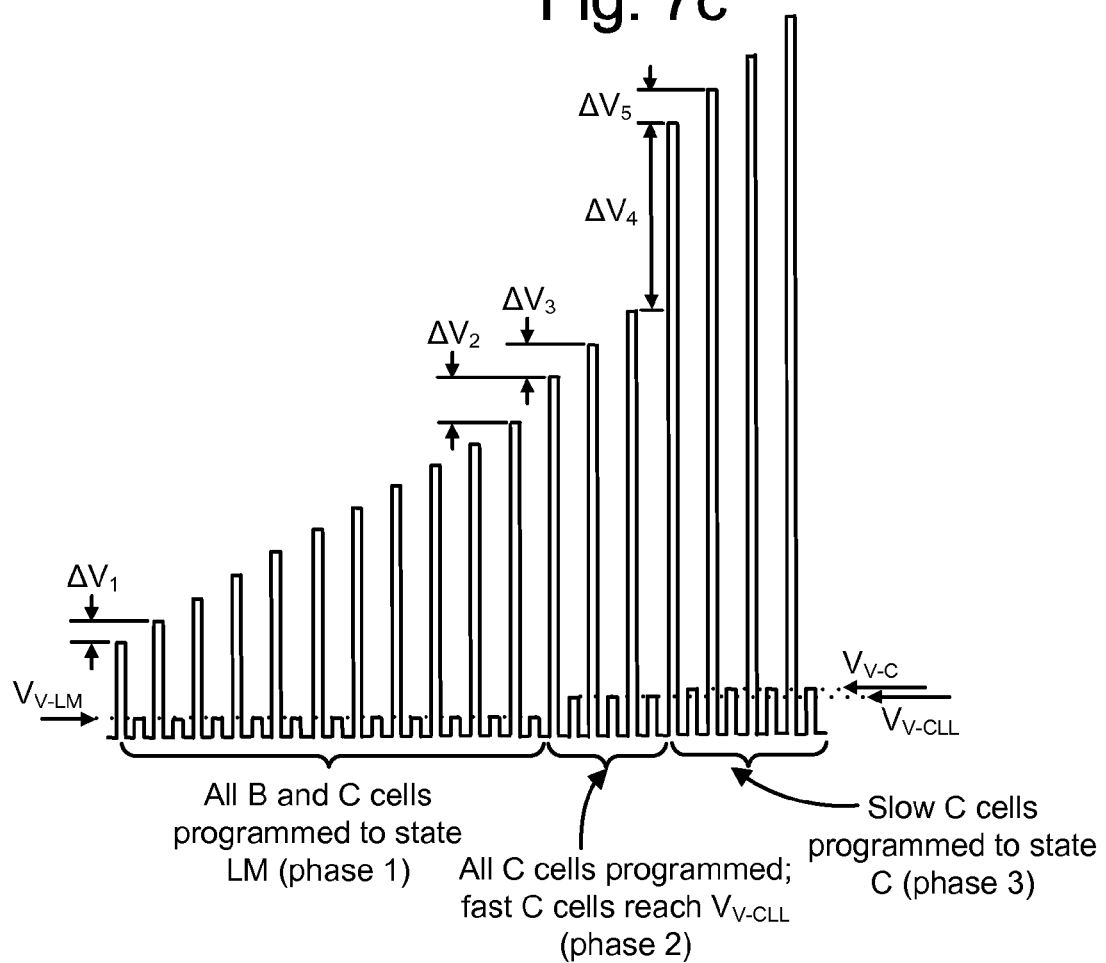
FIG. 7c depicts program and verify voltages in a programming sequence corresponding to FIGS. 6a-d.

After phase 2, a third phase of the first programming pass occurs in which the fast C cells which were identified in phase 2 are temporarily locked out from programming, and programming of the slow C cells continues, as indicated in FIG. 6d. In this example, phase 3 includes four additional program pulses and verification at the $V_{V-C}$ level. Here, it is possible to skip ahead in the program pulse sequence so that a significantly stepped up program pulse is applied at the start of phase 3. By skipping program pulses, we save the corresponding time for those skipped pulses. For example, compared to the approach of FIG. 7a, pulses 15-18 may be skipped so that the first program pulse of phase 3 (fifteenth pulse overall) in FIG. 7c is at the same level as the nineteenth program pulse of FIG. 7a. The second through fourth program pulses in FIG. 7c may then be at the same level as the twentieth through twenty second program pulses, respectively, of FIG. 7a, in one possible approach. The example programming sequence of FIG. 7c thus uses eighteen program pulses as opposed to the example programming sequence of FIG. 7a which uses twenty-two program pulses, resulting in a significant program time savings.

Moreover, the first program pulse of phase 3 may exceed the last program pulse of phase 2 by $\Delta V_4$, while a step size of $\Delta V_5$ is used for subsequent pulses in phase 3. In one approach, $\Delta V_4$ is greater than $\Delta V_2$ and $\Delta V_1$. $\Delta V_5$ may be greater than $\Delta V_1$ and comparable to $\Delta V_3$. In one approach, $\Delta V_4$ is equal to or approximately equal to $V_{V-C} - V_{V-CLL}$, that is, the difference between the C state verify level and the low C state verify level. Generally, the program pulse level can be sharply stepped up in phase 3 compare to prior pulses because it is known that slow cells are being programmed. Such cells are relatively stubborn and therefore require a higher and/or longer duration of program pulse to be applied to their control gates via a selected word line in order to continue to elevate their threshold voltage toward the final intended state. Thus, another option includes extending the duration of the program pulses in addition to, or in lieu of, raising the program pulse level, in phase 3.

After phase 3, the first programming pass is complete, and a second program pass is subsequently performed. Thus, the latter portion of the first programming pass involves the application of a number of program pulses during which only cells targeted for the last, highest state are selected. The starting and final $V_{PGM}$ values, along with the increments and step sizes, are parameters to be optimized during characterization.

Figure 6E:
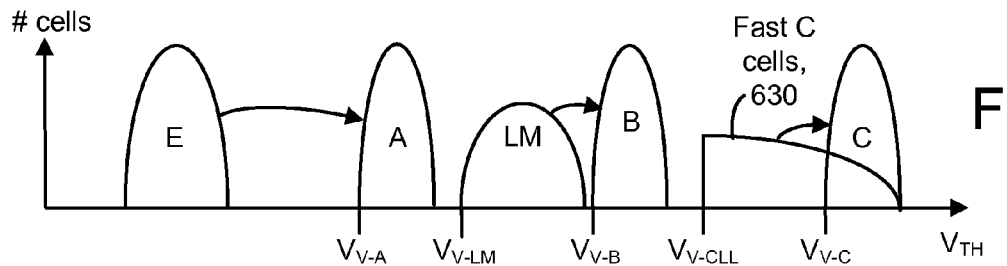
Figure 7D:
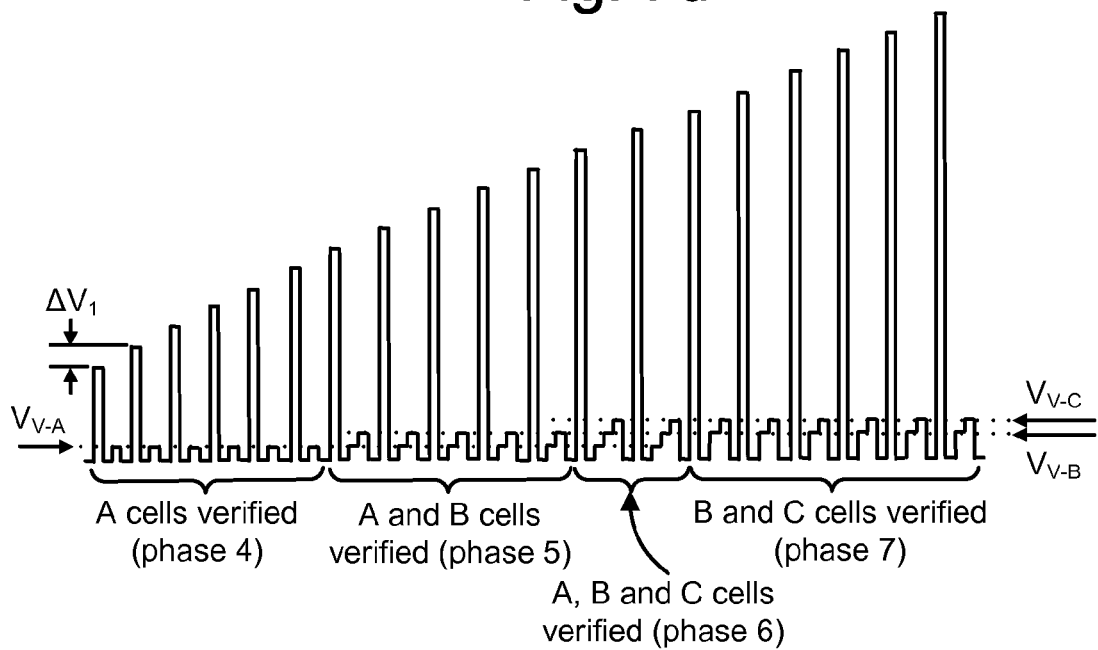
FIG. 7d depicts program and verify voltages in a programming sequence corresponding to FIGS. 6e and 6f.

The second program pass is explained in conjunction with FIGS. 6e and 6f, and FIG. 7d. FIG. 7d depicts program and verify voltages in a programming technique corresponding to FIGS. 6e and 6f. The program pulse sequence of FIG. 7d is a normal sequence in which the program pulses is incremented gradually in regular steps, in one possible approach.

The previously locked out fast C cells (represented by $V_{TH}$ distribution 630) are restored so that they are programmed together with the A and B cells, as depicted in FIG. 6e. The A cells are programmed from the erased state while the B cells are programmed from the LM state. In the program pulse sequence of FIG. 7d, a fourth phase extending over six program pulses can be defined in which an initial pulse is applied followed by pulses which are incremented by $\Delta V_1$, and verification of the A cells is performed using $V_{V-A}$. A fifth phase extending over five program pulses can be defined in which verification of the A and B cells is performed using $V_{V-A}$ and $V_{V-B}$, respectively. A sixth phase extending over two program pulses can be defined in which verification of the A, B and fast C cells is performed using $V_{V-A}$, $V_{V-B}$ and $V_{V-C}$, respectively. A seventh phase extending over six program pulses can be defined in which verification of the B and fast C cells is performed using $V_{V-B}$ and $V_{V-C}$, respectively. At this point, the second program pass, and the entire programming operation, is completed, resulting in the threshold voltage distribution of FIG. 6f.

Since there are no longer any slow-C cells, and only fast C cells remain to be programmed, the second programming pass should finish sooner than in the approach of FIG. 7b. Further, the second programming pass should finish by about the time the program pulse which is at the level of the first program pulse of the third phase in FIG. 7c is reached, e.g., the nineteenth program pulse in FIG. 7d. Thus, the second programming pass may finish after nineteen program pulses rather than the twenty-two program pulses of FIG. 7b, resulting in a significant program time savings. In the example provided, the time savings is seven program pulses total over the first and second programming passes. See FIG. 10 for further details.

Figure 6G:
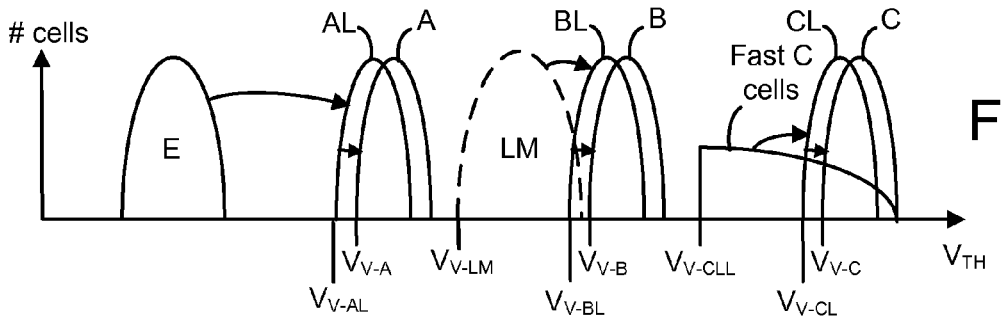

Optionally, the techniques mentioned herein can be modified to include a coarse/fine programming process, as depicted in FIG. 6g. Coarse/fine programming involves programming cells initially in a coarse mode in which the cells are programmed relatively quickly. This may be achieved by use of a relatively large or aggressive program pulse step size or pulse duration, for instance. When a cell is verified at a level (coarse mode verify levels $V_{V-AL}$, $V_{V-BL}$ and $V_{V-CLL}$ for states A, B and C, respectively) which is below the verify level of the final intended programming state, the cell is switched to a fine programming mode in which the cell is programmed relatively slowly. This allows the cell to be programmed more accurately since overshoots are reduced. The fine programming mode may involve, e.g., applying program pulses with a smaller step size and/or pulse duration and/or raising a bit line voltage to slow the rate of programming. Threshold voltage distributions which are reached in the coarse mode are labeled AL, BL and CL, to distinguish them from threshold voltage distributions which are reached in the fine mode, which are labeled A, B and C, respectively. The programming to the LM state need not use coarse/fine programming as it is an intermediate state, so accuracy is less critical.

For example, in the first programming pass, in which the slow C cells are programmed to the C state (e.g., FIG. 6d), after a slow C cell is verified at $V_{V-CL}$, it is switched to the fine programming mode in which the final verify level of $V_{V-C}$ is subsequently applied. In the second programming pass, the A, B and fast C cells are verified initially at $V_{V-AL}$, $V_{V-BL}$ and $V_{V-CL}$, respectively, while in the coarse mode, and at $V_{V-A}$, $V_{V-B}$ and $V_{V-C}$, respectively, while in the fine mode. In one option, coarse/fine techniques may be used for the C cells in a limited manner such that it is used only for the fast C cells which are programmed during the second programming pass. An example of a coarse/fine programming technique is discussed in U.S. Pat. No. 7,088,621, incorporated herein by reference. It is also possible to optimize the bit-line voltage or the pulse number separately for the "C-first" pass (e.g., phase 3) as compared to the following "A" & "B" pass (e.g., phases 4-7). Such optimization may include setting a maximum number of allowed "fine" pulses in order to avoid increases to programming time.

Further, other modifications are applicable to any of the above-mentioned techniques, including those discussed in connection with FIGS. 7a-d. In one approach, different program conditions are implemented in different phases or parts of a programming pass and/or in different programming passes. For instance, the first and second programming passes can have different sweep parameters to separately optimize the two passes for goals such as performance, distribution width, and program-disturb properties. One example is to use a larger program pulse step size during the first programming pass versus the second programming pass in order to have an independent trade-off of speed versus distribution width. Another example is to use different program-inhibit parameters which are applied and optimized independently for the two programming passes. For instance, different channel boosting modes may be implemented via different pass voltages which are applied on the unselected word lines in the first and second programming passes. See U.S. Pat. No. 6,859,397, incorporated herein by reference for example of different channel boosting modes. See also FIG. 4, which depicts pass voltages applied to unselected word lines during programming. A different maximum allowed number of program pulses in a fine programming mode which follows a coarse programming mode may also be used. Different bit line voltages may also be used, such as during a fine programming mode. Various other options are possible. Essentially any parameter which can be set to influence programming can be optimized for different phases or parts of a programming pass and/or in different programming passes of an overall programming process.

Figure 8A:
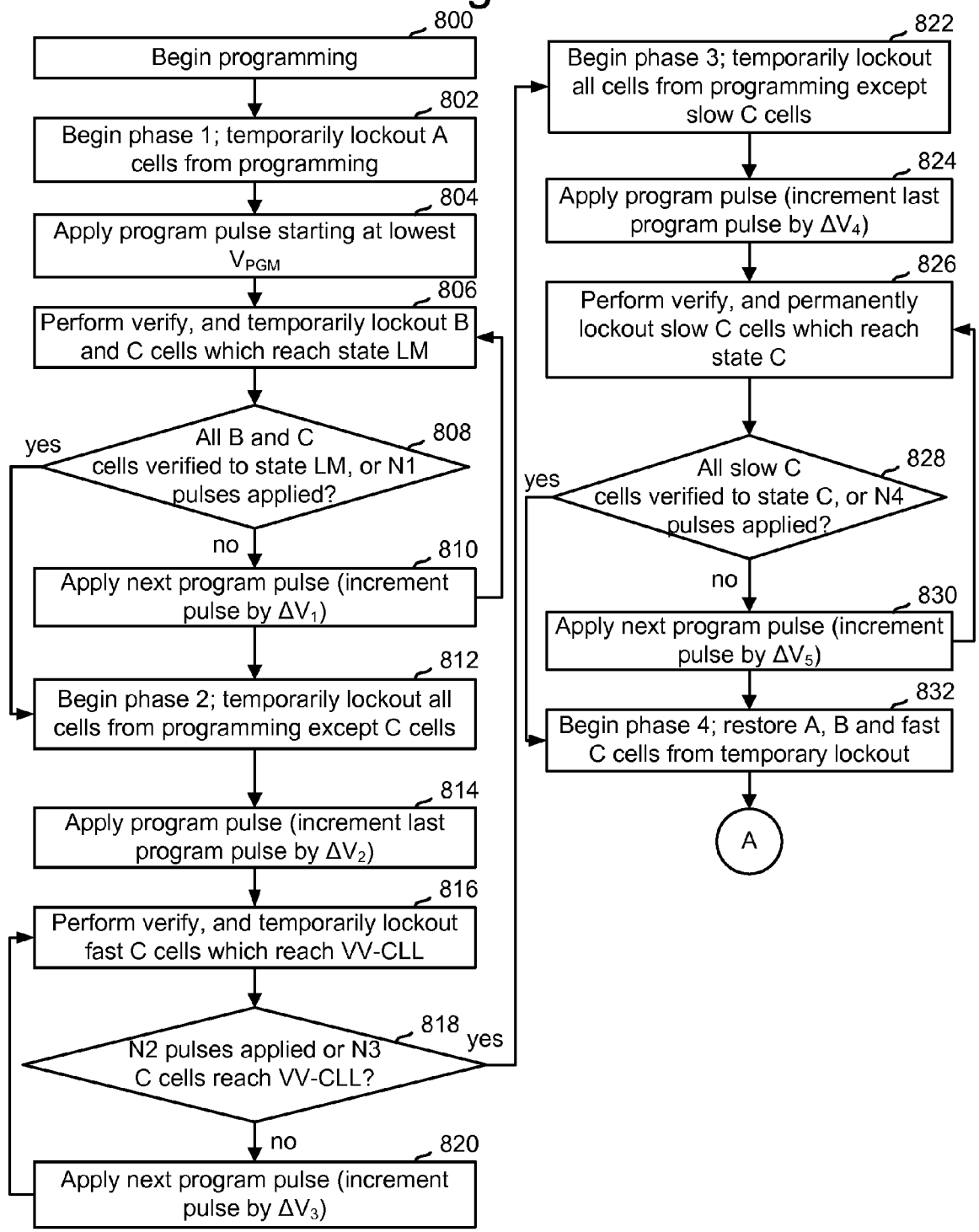
FIGS. 8a and 8b describe a programming process corresponding to FIGS. 6a-g.
Figure 8B:
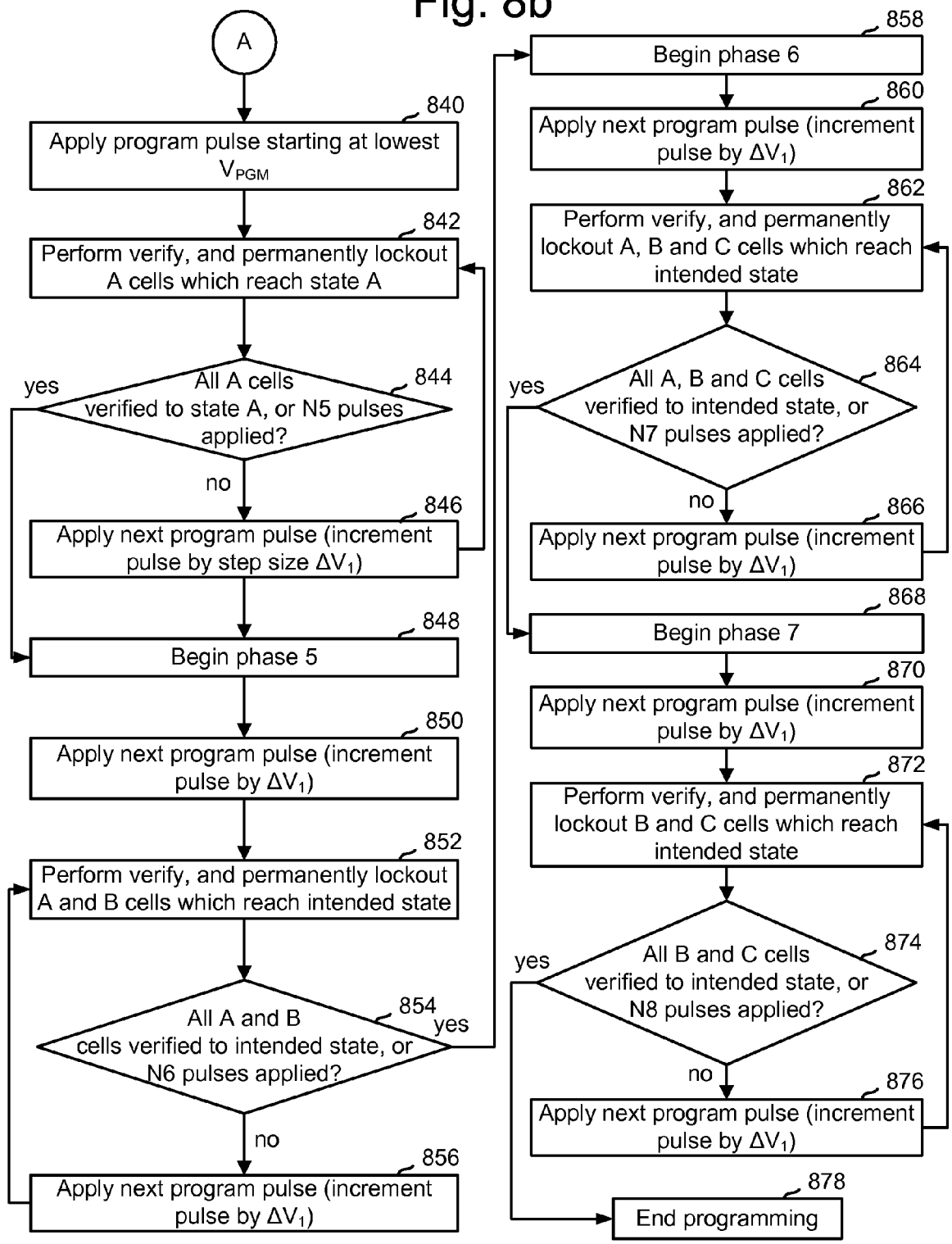

FIGS. 8a and 8b describe a programming process corresponding to FIGS. 6a-f. The specific implementation discussed involves four states. However, other implementations are possible. In FIG. 8a, programming begins at step 800. Phase 1 (see also FIG. 7c) begins at step 802, in which the A cells are temporarily locked out from programming. Note that the cells which are intended to remain in the erased state are locked out from programming throughout the programming process. Step 804 includes applying a program pulse starting at the lowest $V_{PGM}$ level. Step 806 includes performing a verify at $V_{V-LM}$ and temporarily locking out the B and C cells which reach state LM (e.g., the cells for which $V_{TH}>V_{V-LM}$). The term "lockout" refers to preventing further programming of a cell such as by raising the voltage of an associated bit line, while other cells continue to be programmed. Decision step 808 determines if all B and C cells have been verified to state LM, or whether some number N1 of program pulses have been applied. If neither case is true, a next program pulse is applied at step 810, incrementing the prior pulse by $\Delta V_1$. The process then loops back to step 806. If decision step 808 is true, phase 2 of the first programming pass begins at step 812. Here, all cells are temporarily locked out from programming except the C cells (e.g., the A and B cells are locked out). The C cells may be considered to be a first set of storage elements while the A and B cells are second and third sets of storage elements, respectively. Step 814 includes applying a program pulse which is incremented from the prior pulse by $\Delta V_1$.

Step 816 includes performing a verify at $V_{V-CLL}$ and temporarily locking out the C cells whose $V_{TH}>V_{V-CLL}$. These locked out cells are the fast C cells. Decision step 818 determines if some number N2 of program pulses have been applied, or some number or portion N3 of C cells have reached $V_{V-CLL}$. Another option is to determine whether some number or portion of C cells have reached $V_{V-CLL}$ and some number of additional program pulses have been applied. If neither case is true, a next program pulse is applied at step 820, incrementing the prior pulse by $\Delta V_3$. The process then loops back to step 816. If decision step 818 is true, phase 3 of the first programming pass begins at step 822. Here, all cells are temporarily locked out from programming except the slow C cells (e.g., the A, B and fast C cells are locked out). Step 824 includes applying a program pulse which is incremented from the prior pulse by $\Delta V_4$.

Step 826 includes performing a verify at $V_{V-C}$ and permanently locking out the slow C cells for which $V_{TH}>V_{V-C}$. The permanent lock out refers to a lockout which extends through the current programming operation. Decision step 828 determines if all slow C cells have reached state C or whether some number N4 of program pulses have been applied. Note that the number of program pulses referred to herein (e.g., N1-N8) can be expressed in terms of program pulses in the current phase and/or total number of program pulses in the current programming pass. If neither case is true in decision step 828, a next program pulse is applied at step 830, incrementing the prior pulse by $\Delta V_5$. The process then loops back to step 826. If decision step 828 is true, phase 4, and the second programming pass, begins at step 832. Here, the A, B and fast C cells are restored from their temporary lockout so that they can be programmed. The process continues at FIG. 8b.

In FIG. 8b, step 840 includes applying a program pulse starting again at the lowest $V_{PGM}$, or other initial $V_{PGM}$ value. Step 842 includes performing a verify at $V_{V-A}$ and permanently locking out the A cells for which $V_{TH}>V_{V-A}$. Decision step 844 determines if all A cells have reached state A or whether some number N5 of program pulses have been applied. If neither case is true, a next program pulse is applied at step 846, incrementing the prior pulse by $\Delta V_1$, in one possible approach. The process then loops back to step 842. If decision step 844 is true, phase 5 begins at step 848, in which case the next program pulse, using an increment of $\Delta V_1$, is applied at step 850. Step 852 includes performing verify operations at $V_{V-A}$ and $V_{V-B}$ and permanently locking out the A and B cells for which $V_{TH} > V_{V-A}$ or $V_{TH} > V_{V-B}$, respectively. Decision step 854 determines if all A and B cells have reached state A and B, respectively, or whether some number N6 of program pulses have been applied. If neither case is true, a next program pulse is applied at step 856, incrementing the prior pulse by $\Delta V_1$. The process then loops back to step 852. If decision step 854 is true, phase 6 begins at step 858, in which case the next program pulse, using an increment of $\Delta V_1$, is applied at step 860.

Step 862 includes performing verify operations at $V_{V-A}$, $V_{V-B}$ and $V_{V-C}$ and permanently locking out the A, B and C cells which reach their intended state (e.g., for which $V_{TH} > V_{V-A}$, $V_{TH} > V_{V-B}$ and $V_{TH} > V_{V-C}$, respectively). Decision step 864 determines if all A, B and C cells have reached the intended state A, B or C, or whether some number N7 of program pulses have been applied. If neither case is true, a next program pulse is applied at step 866, incrementing the prior pulse by $\Delta V_1$. The process then loops back to step 862. If decision step 864 is true, phase 7, the final phase of the second programming pass, begins at step 868, in which case the next program pulse, using an increment of $\Delta V_1$, is applied at step 870. Step 872 includes performing verify operations at $V_{V-B}$ and $V_{V-C}$ and permanently locking out the B and C cells which reach their intended state (e.g., for which $V_{TH} > V_{V-B}$ and $V_{TH} > V_{V-C}$, respectively). Decision step 874 determines if all B and C cells have reached state B and C, respectively, or whether some number N8 of program pulses have been applied. If neither case is true, a next program pulse is applied at step 876, incrementing the prior pulse by $\Delta V_1$. The process then loops back to step 872. If decision step 874 is true, the programming is concluded at step 878.

FIG. 9a describes a multi-pass programming process in which a different programming condition is used in each pass. As discussed, different program conditions can be implemented in different phases or parts of a programming pass and/or in different programming passes. This can allow optimizing the two programming passes or parts thereof for goals such as performance, distribution width, and program-disturb properties. Examples of a programming condition include: program pulse step size, program pulse duration, program-inhibit parameters, channel boosting modes, pass voltages, maximum allowed number of program pulses in a fine programming mode, and bit line voltage used, such as during a fine programming mode. Step 900 includes starting a first programming pass. Step 902 includes implementing a first programming condition. Step 904 includes programming the C cells and locking out the fast C cells. Step 906 includes programming the slow C cells. Step 908 includes starting a second programming pass. Step 910 includes implementing a second programming condition which is different than the first programming condition. Step 912 includes programming the A, B and fast C cells.

FIG. 9b describes a multi-pass programming process in which high state cells are programmed before lower state cells. Although example implementations have been provided in which four data states are used, and state C is the highest data state, other implementations are possible. For example, it is possible to use eight or sixteen data states. Also, it is possible to perform the fast-slow technique for more than one high state. For example, with eight data states, the two highest states may be programmed first using the techniques discussed herein. In such a case, the fast and slow cells in the two highest states are determined in the first programming pass, and the fast cells are locked out while the slow cells are complete programming. In the second programming pass, all other cells are programmed to their final intended state along with the fast cells in the two highest states. Various other approaches are possible as well.

Step 920 includes starting a first programming pass. Step 922 includes programming the cells to an intermediate state (e.g., the LM state). Step 924 includes programming the high state cells and locking out the fast high state cells after they are detected. Step 926 includes programming the slow high state cells. Step 928 includes starting a second programming pass. Step 930 includes programming the remaining cells, including the fast high state cells.

FIG. 10 depicts a table of program pulse number versus verify level for three different programming techniques. Case #1 refers to a one-pass programming technique such as discussed below in connection with FIG. 16. Case #2 refers to a multi-pass programming technique such as discussed above in connection with FIGS. 7a and 7b. Case #3 refers to a multi-pass programming technique such as discussed above in connection with FIGS. 7c and 7d. The leftmost column denotes the program pulse number, ranging from 1-22. The verify levels A, B and C refer to $V_{V-A}$, $V_{V-B}$ and $V_{V-C}$ for states A, B and C, respectively. Additionally, when coarse/fine programming is used, the coarse verify levels A, BL and CL refer to $V_{V-AL}$, $V_{V-BL}$ and $V_{V-CL}$ for states A, B and C, respectively (see FIG. 6g) and $V_{V-A}$, $V_{V-B}$ and $V_{V-C}$ are the fine verify levels. CLL denotes the verify level $V_{V-CLL}$.

Case #1 involves 13 verify operations at $V_{V-A}$ and/or $V_{V-AL}$, 13 verify operations at $V_{V-B}$ and/or $V_{V-BL}$ and 11 verify operations at $V_{V-C}$ and/or $V_{V-CL}$, for a total of 63 verify operations. Additionally, 22 program loops (e.g., program pulses) are applied. A total of 85 operations are thus performed. Case #2 involves 11 operations at $V_{V-C}$, 13 operations at $V_{V-A}$ and/or $V_{V-AL}$ and 13 verify operations at $V_{V-B}$ and/or $V_{V-BL}$, for a total of 63 verify operations. Additionally, 30 program pulses (in total, over two programming passes) are applied. A total of 93 operations are thus performed. Case #3 involves 4 verify operations at $V_{V-CLL}$, 13 verify operations at $V_{V-A}$ and/or $V_{V-AL}$, 13 verify operations at $V_{V-B}$ and/or $V_{V-BL}$ and 8 verify operations at $V_{V-CL}$ and/or $V_{V-C}$, for a total of 65 verify operations. Additionally, 24 program pulses (in total, over two programming passes) are applied. A total of 89 operations are thus performed. Thus, case #3 saves the time involved in applying six additional program pulses compared to case #2. This savings is offset slightly by the need for two additional verify operations, but the overall benefit is still significant. The time savings which may be realized may be even greater in other applications.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315, 5,774,397 and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data.

Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214, and a power control module 1216. The state machine 1212 provides chip-level control of memory operations, including controlling pre-charging. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, etc.

Figure 13:
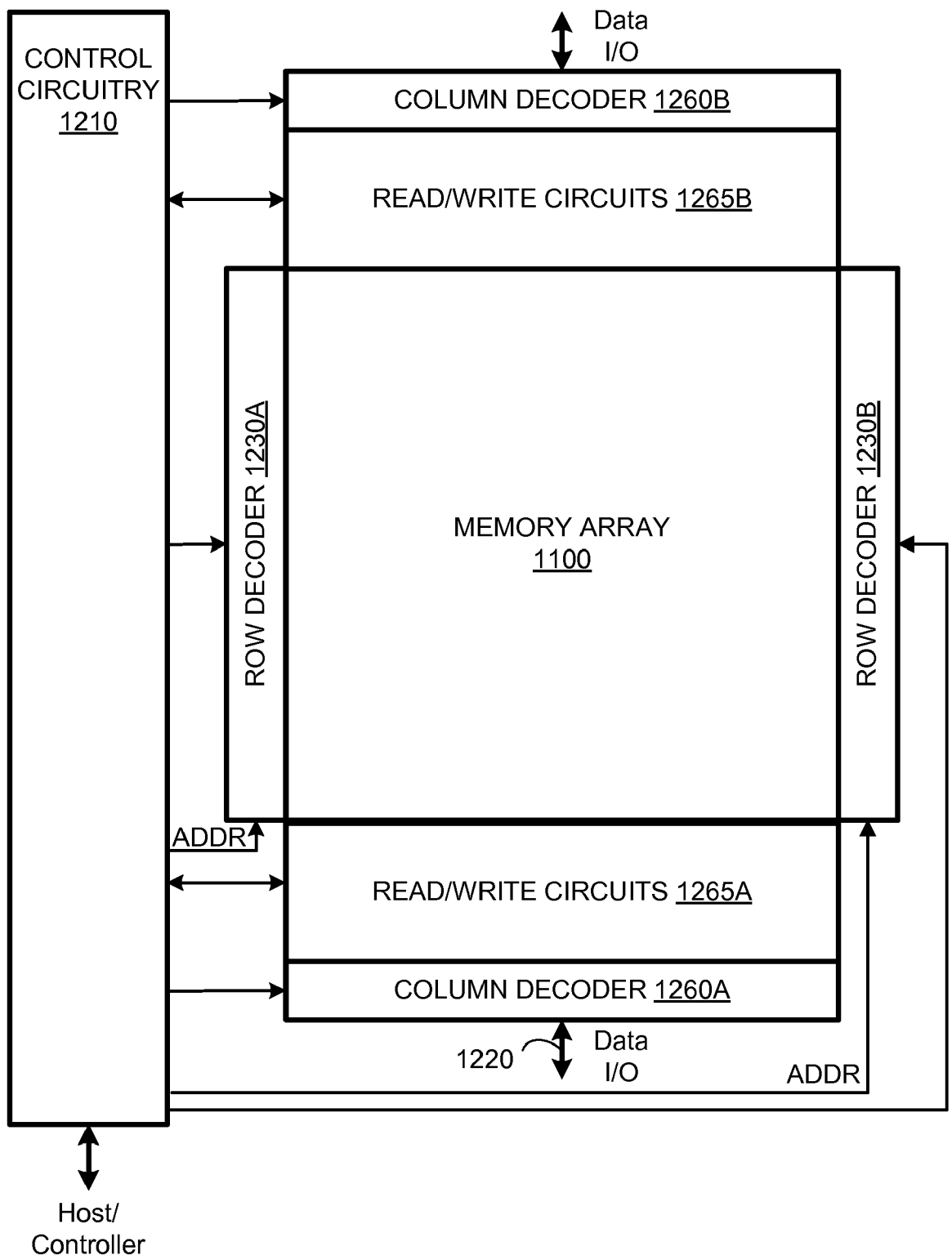
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
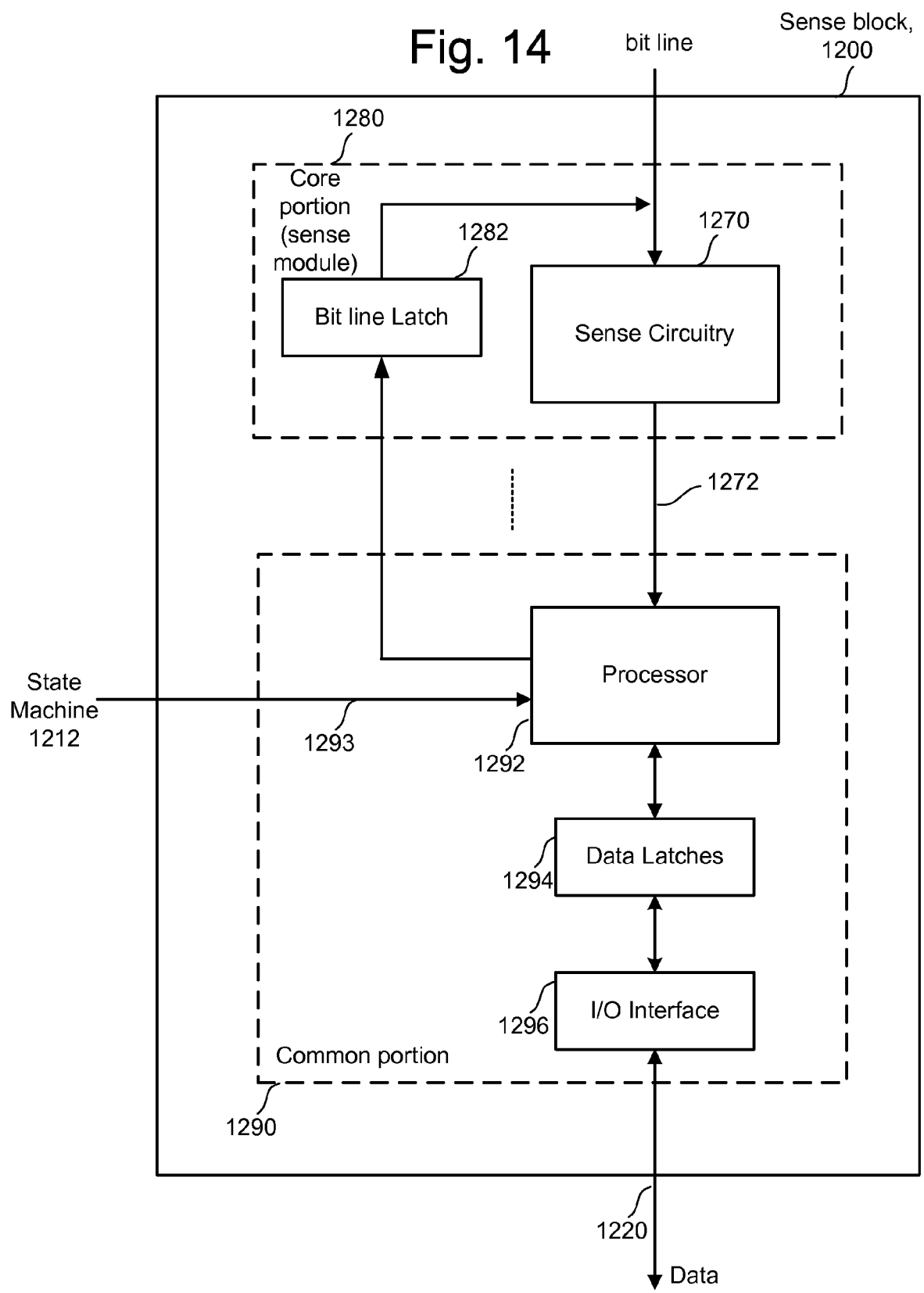
FIG. 14 is a block diagram depicting one embodiment of a sense block.

FIG. 14 is a block diagram depicting one embodiment of a sense block. Sensing operations such as verify and read involve a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in U.S. Pat. Nos. 7,196,931, 7,023,736, 7,046,568, 7,196,928 and 7,327,619. All five of the immediately above-listed patent documents are incorporated herein by reference in their entirety.

Figure 15:
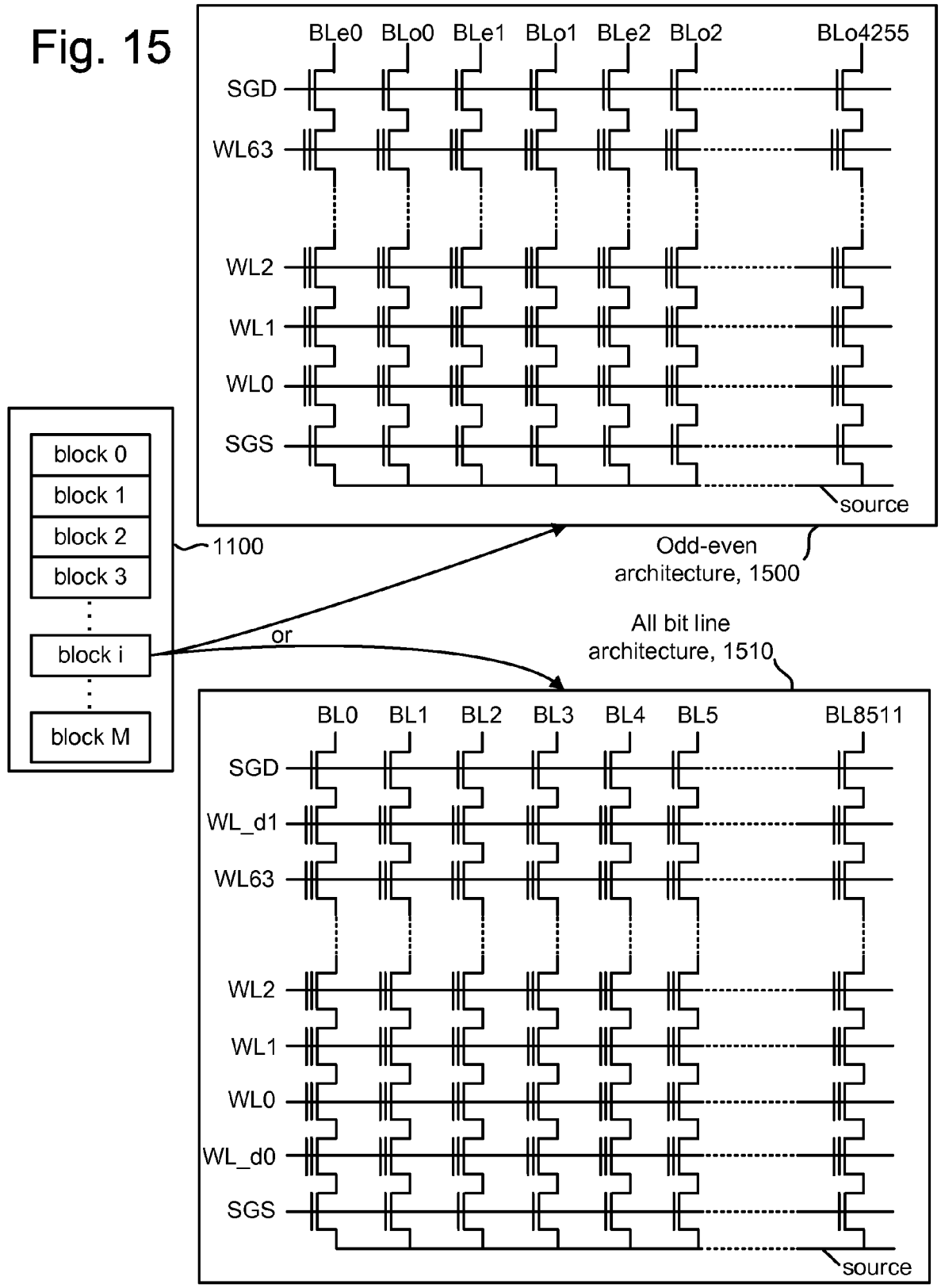
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1500), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 16:
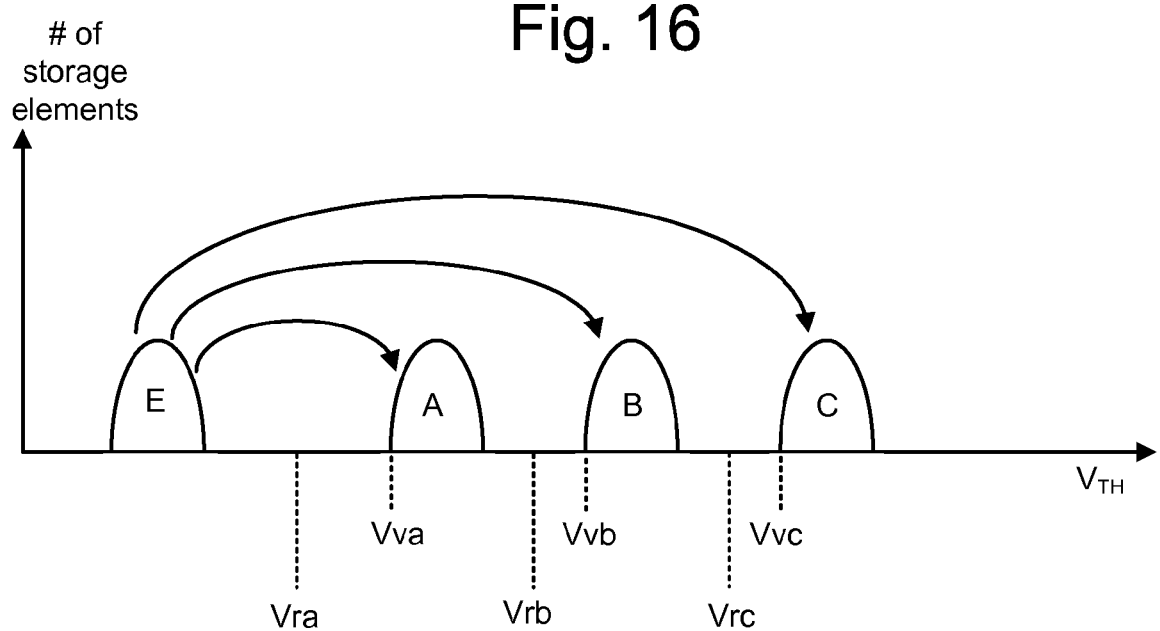
FIG. 16 depicts an example set of threshold voltage distributions and one-pass programming.

FIG. 16 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 17:
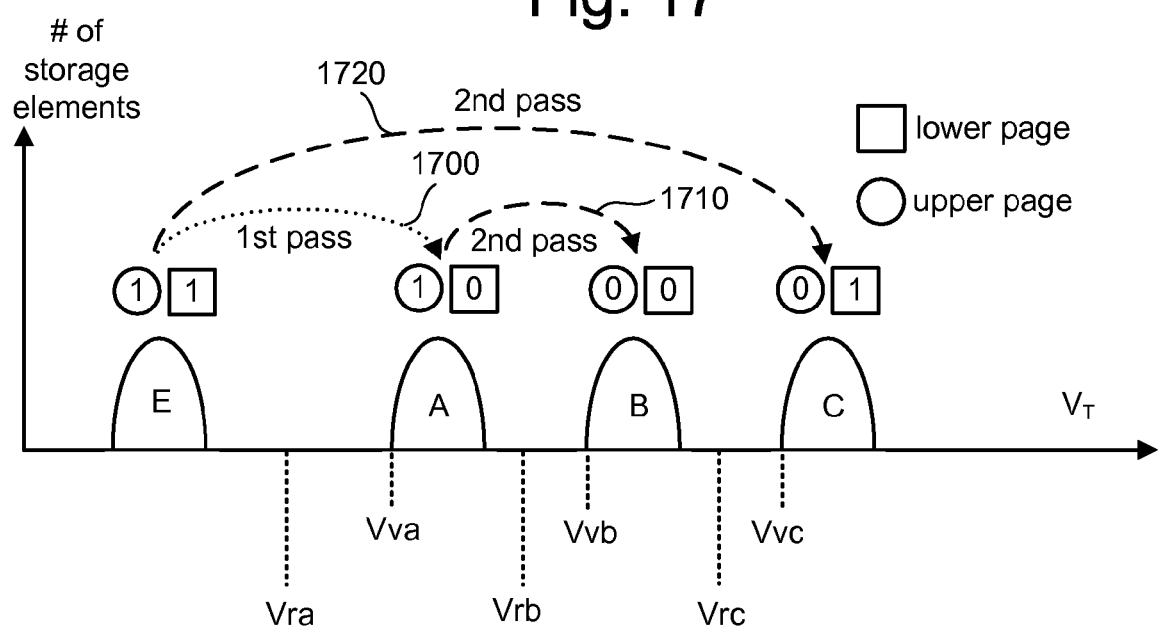
FIG. 17 depicts an example set of threshold voltage distributions and two-pass programming.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1700. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

More details of such an embodiment are disclosed in U.S. Pat. No. 7,120,051, incorporated herein by reference in its entirety.

Figure 18A:
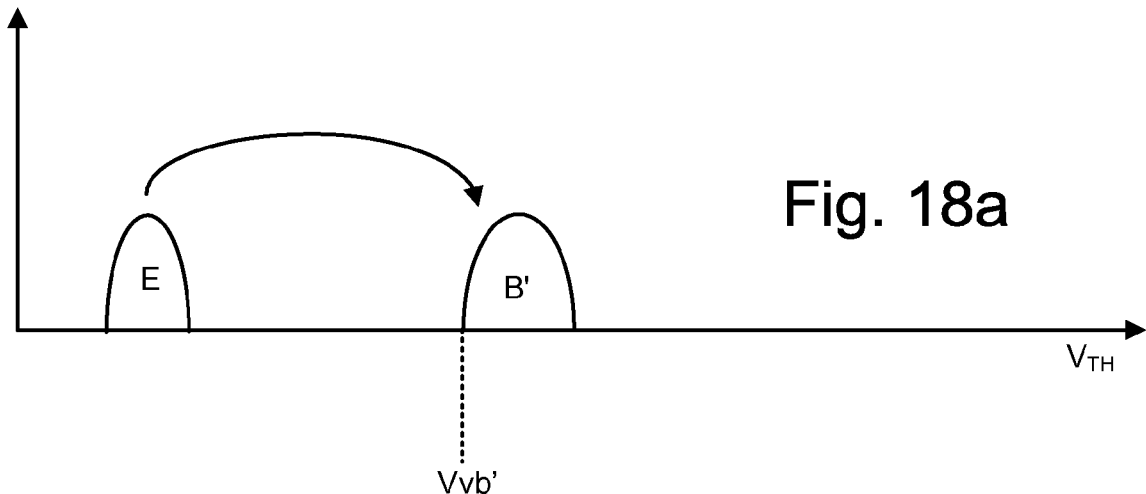
FIGS. 18a-c show various threshold voltage distributions and describe a process for programming non-volatile memory.
Figure 18B:
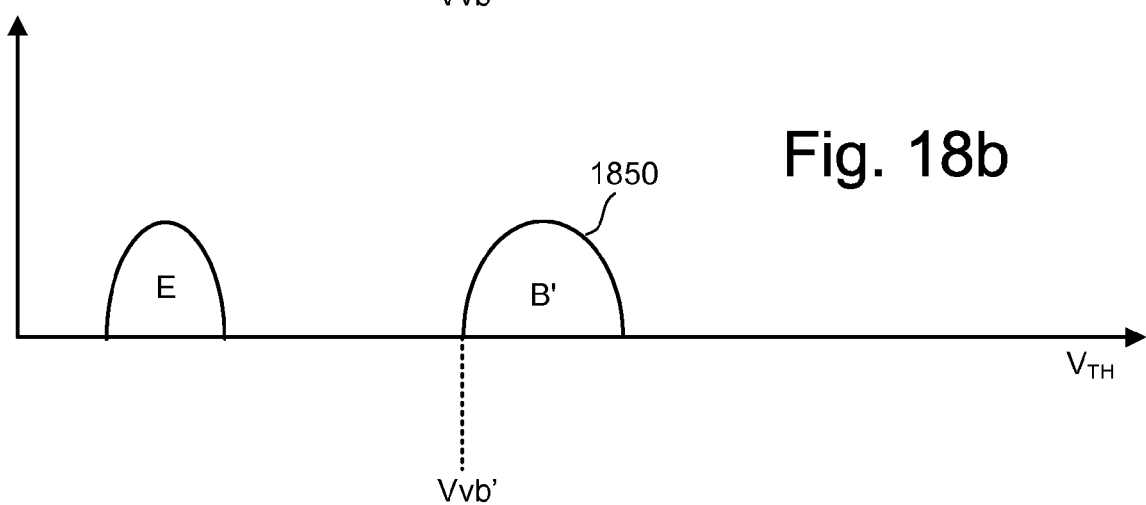
Figure 18C:
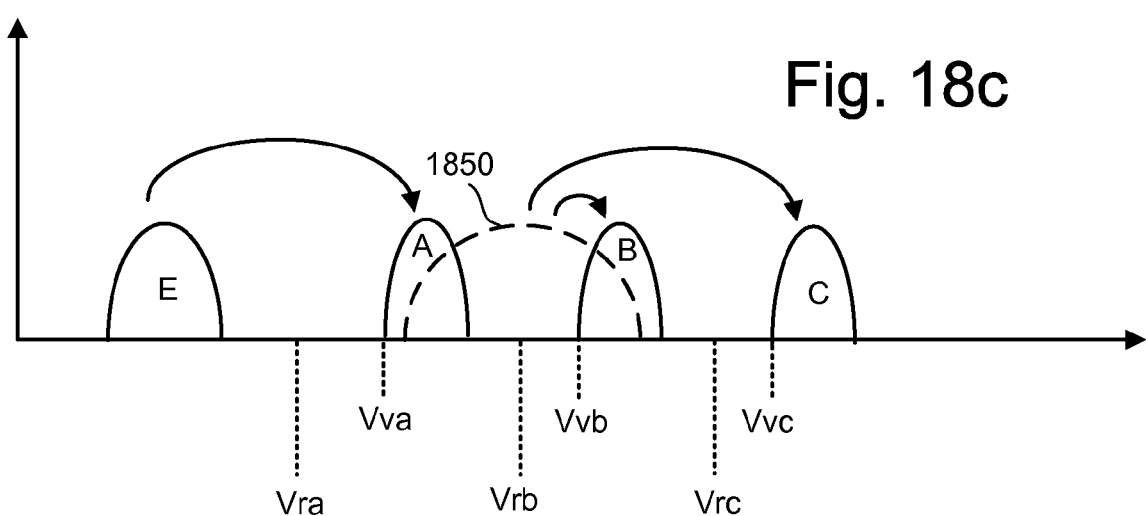

FIGS. 18a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18b. This apparent widening of the threshold voltage distribution will be remedied when programming the upper page.

FIG. 18c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18a-c reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18a-c provide an example with respect to four data states and two pages of data, the concepts taught can be applied to other implementations with more or fewer than four states and more or less than two pages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   a) performing programming operations on a first set of storage elements using a first verify level less an offset to distinguish slower and faster programming storage elements, while locking out at least a second set of storage elements from being programmed;
   b) locking out the faster programming storage elements while continuing programming of the slower programming storage elements using the first verify level and while continuing to lock out the at least a second set of storage elements;
   c) locking out the slower programming storage elements while resuming programming of the faster programming storage elements using the first verify level and while programming the at least a second set of storage elements using at least a second verify level which is less than the first verify level less the offset.

2. The method of claim 1, further comprising:
the first set of storage elements and the at least a second set of storage elements are programmed from a common threshold voltage distribution.

3. The method of claim 1, further comprising:
performing programming operations on the first and second sets of storage elements prior to step a), including applying program pulses which are incremented by a first step size, step b) includes applying program pulses which are incremented by a higher, second step size.

4. The method of claim 3, wherein:
step a) includes applying a first set of program pulses which are incremented by a first step size, and step b) includes applying a second set of program pulses, a first program pulse of the second set is incremented from a last program pulse of the first set of program pulses by more than the first step size.

5. The method of claim 4, wherein:
the first program pulse of the second set is incremented from the last program pulse of the first set of program pulses by the offset.

6. The method of claim 1, wherein:
the first verify level is for a highest data state, and the at least a second verify level is for a second highest data state.

7. The method of claim 1, wherein:
step c) includes programming a third set of storage elements using a third verify level which is less than the second verify level.

8. The method of claim 1, wherein:
steps a) and b) allow programming only of storage elements which are intended to be programmed to a data state associated with the first verify level.

9. The method of claim 1, further comprising:
concluding step a) when a specified number or portion of storage elements in the first set of storage elements have been verified at the first verify level less the offset.

10. The method of claim 1, wherein step a) comprises applying program pulses, the method further comprising:
concluding step a) when a specified number of the program pulses have been applied.

11. The method of claim 1, wherein step a) comprises applying program pulses, the method further comprising:
concluding step a) when a specified number of additional program pulses have been applied after a specified number or portion of storage elements in the first set of storage elements have been verified at the first verify level less the offset.

12. A method for operating non-volatile storage, comprising:
programming a first set of storage elements which are intended to be programmed to a first data state associated with a first verify level, while locking out from programming at least a second set of storage elements which are intended to be programmed to a second data state associated with a second verify level, and a third set of storage elements which are intended to be programmed to a third data state associated with a third verify level, the second and third verify levels are below the first verify level;
during the programming, distinguishing slower and faster programming storage elements among the first set of storage elements, and locking out the faster programming storage elements while continuing programming of the slower programming storage elements under a first programming condition; and
subsequently programming the at least a second and third sets of storage elements to the second and third data states, respectively, while resuming programming of the faster programming storage elements to the first data state under a second programming condition which differs from the first programming condition.

13. The method of claim 12, wherein:
the first and second programming conditions comprise first and second programming pulse step sizes, respectively.

14. The method of claim 12, wherein:
the first and second programming conditions comprise first and second bit line voltages, respectively.

15. The method of claim 12, wherein:
the first and second programming conditions comprise first and second maximum numbers of program pulses, respectively, in a fine programming mode which follows a coarse programming phase.

16. The method of claim 12, wherein:
the first and second programming conditions comprise first and second channel boosting modes, respectively.

17. A method for operating non-volatile storage, comprising:
a) programming a first set of storage elements which are intended to be programmed to a first data state associated with a first verify level, while locking out from programming a second set of storage elements which are intended to be programmed to a second data state associated with a second verify level, and a third set of storage elements which are intended to be programmed to a third data state associated with a third verify level, where the third verify level is below the second verify level and the second verify level is below the first verify level; and
b) after step a), programming the second and third sets of storage elements, step a) uses a programming condition which differs from a programming condition of step b), the different programming conditions comprise different boosting modes which are implemented by applying a voltage to unselected word lines in step a) which differs from a voltage applied to unselected word lines in step b).

18. The method of claim 17, wherein:
steps a) and b) each include applying a series of step-wise increasing program pulses, and the different programming conditions include different programming pulse step sizes in steps a) and b).

19. The method of claim 17, wherein:
steps a) and b) each include applying a series of program pulses in a coarse programming phase and a following fine programming mode, and the different programming conditions include bit line voltages raised to a level in the fine programming mode of step a) which differs from a level in the fine programming mode of step b).

20. The method of claim 17, wherein:
steps a) and b) each include applying a series of program pulses in a coarse programming phase and a following fine programming mode, and the different programming conditions include allowing a maximum number of program pulses in the fine programming mode of step a) which differs from a maximum number of program pulses in the fine programming mode of step b).

21. The method of claim 17, wherein:
step b) further includes locking out from programming the first set of storage elements.

22. A method for operating non-volatile storage, comprising:
a) programming a first set of storage elements which are intended to be programmed to a first data state associated with a first verify level from an erased state to an intermediate state which is associated with an intermediate verify level, the intermediate verify level is below the first verify level;
b) programming a second set of storage elements which are intended to be programmed to a second data state which is associated with a second verify level from the erased state to the intermediate state, the second verify level is below the first verify level and above the intermediate verify level;
c) during step a) and b), locking out from programming a third set of storage elements which are intended to be programmed to a third data state which is associated with a third verify level, the third verify level is below the intermediate verify level and above the erased state; and
d) using a programming condition which differs from a programming condition used in step a), programming the second set storage elements from the intermediate state to the second data state, and programming the third set storage elements from the erased state to the third data state.

23. A non-volatile storage system which performs the method of claim 1.

24. A non-volatile storage system which performs the method of claim 12.

25. A non-volatile storage system which performs the method of claim 17.

26. A non-volatile storage system which performs the method of claim 22.

* * * * *